(12) United States Patent
Wu et al.

(10) Patent No.: US 11,233,156 B2
(45) Date of Patent: Jan. 25, 2022

(54) MEMORY DEVICE AND MANUFACTURING METHOD THEREOF

(71) Applicant: TAIWAN SEMICONDUCTOR MANUFACTURING CO., LTD., Hsinchu (TW)

(72) Inventors: Wei-Cheng Wu, Hsinchu County (TW); Chih-Ren Hsieh, Changhua County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/743,926

(22) Filed: Jan. 15, 2020

(65) Prior Publication Data

US 2021/0217892 A1 Jul. 15, 2021

(51) Int. Cl.
| | |
|---|---|
| *H01L 21/26* | (2006.01) |
| *H01L 21/28* | (2006.01) |
| *H01L 29/78* | (2006.01) |
| *H01L 29/66* | (2006.01) |
| *H01L 29/06* | (2006.01) |
| *H01L 29/788* | (2006.01) |
| *H01L 29/423* | (2006.01) |
| *H01L 29/45* | (2006.01) |
| *H01L 21/285* | (2006.01) |
| *H01L 21/265* | (2006.01) |

(52) U.S. Cl.
CPC .... *H01L 29/7881* (2013.01); *H01L 21/26513* (2013.01); *H01L 21/28518* (2013.01); *H01L 29/0653* (2013.01); *H01L 29/40114* (2019.08); *H01L 29/42328* (2013.01); *H01L 29/45* (2013.01); *H01L 29/66545* (2013.01); *H01L 29/66795* (2013.01); *H01L 29/66825* (2013.01); *H01L 29/7851* (2013.01)

(58) Field of Classification Search
CPC ... H01L 21/26; H01L 21/26513; H01L 21/28; H01L 21/28518; H01L 29/06; H01L 29/0653; H01L 29/40; H01L 29/40114; H01L 29/42; H01L 29/42328; H01L 29/45; H01L 29/66; H01L 29/66545; H01L 29/66795; H01L 29/66825; H01L 29/78; H01L 29/785; H01L 29/7851; H01L 29/7881
USPC ....................................................... 257/319
See application file for complete search history.

(56) References Cited

U.S. PATENT DOCUMENTS

| | | | |
|---|---|---|---|
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |

(Continued)

*Primary Examiner* — Fazli Erdem
(74) *Attorney, Agent, or Firm* — Maschoff Brennan

(57) ABSTRACT

A memory device includes a semiconductor fin, a floating gate, a control gate, a source region, an erase gate, and a select gate. The floating gate is above and conformal to the semiconductor fin. The control gate is above the floating gate. The source region is in the semiconductor fin. The erase gate is above the source region and adjacent the control gate. The select gate is above the semiconductor fin. The control gate is between the erase gate and the select gate.

20 Claims, 26 Drawing Sheets

(56) References Cited

U.S. PATENT DOCUMENTS

| | | | |
|---|---|---|---|
| 9,812,363 B1 | 11/2017 | Liao et al. | |
| 9,859,380 B2 | 1/2018 | Lee et al. | |
| 2016/0064398 A1* | 3/2016 | Toh | H01L 29/66825 |
| | | | 257/316 |
| 2016/0379987 A1* | 12/2016 | Liu | H01L 29/7851 |
| | | | 257/316 |
| 2019/0326305 A1* | 10/2019 | Zhou | H01L 29/66825 |
| 2020/0152646 A1* | 5/2020 | Fan | H01L 27/11519 |
| 2020/0176459 A1* | 6/2020 | Zhou | H01L 27/11526 |

* cited by examiner

MEMORY DEVICE AND MANUFACTURING METHOD THEREOF

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the polysilicon gate electrode with a metal gate electrode to improve device performance with the decreased feature sizes.

Super-flash technology has enabled designers to create cost effective and high performance programmable SOC (system on chip) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
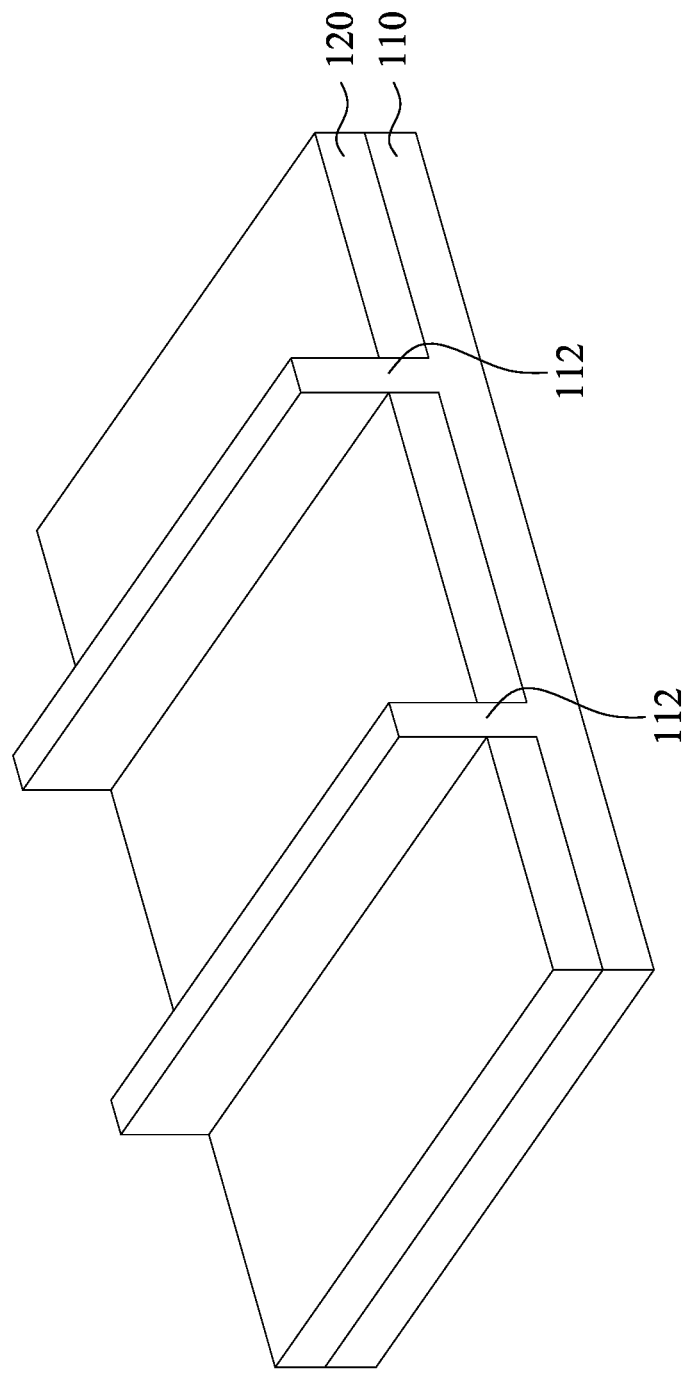
FIGS. 1-16C illustrate a method for manufacturing a memory device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Some embodiments of the present disclosure relate to embedded flash memory devices in FinFET technology. Although some implementations are illustrated below with regards to split gate flash memory, it will be appreciated that this concept is not limited to split gate flash memory cells, but is also applicable to other types of flash memory cells.

FIGS. 1-16C illustrate a method for manufacturing a memory device at various stages in accordance with some embodiments of the present disclosure. Reference is made to FIG. 1. A substrate 110 is provided. In some embodiments, the substrate 110 may include silicon (Si). Alternatively, the substrate 110 may include germanium (Ge), silicon germanium, gallium arsenide (GaAs) or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

The substrate 110 further includes a plurality of semiconductor fins 112 protruding from the substrate 110. The semiconductor fins 112 serve as source/drain regions and channels of the following formed memory cells 10 (see FIG. 14B). It is note that the number of the semiconductor fins 112 in FIG. 1 is illustrative, and should not limit the claimed scope of the present disclosure. The semiconductor fins 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 112) and developed to remove portions of the photoresist material. The remaining photoresist material protects the underlying material from subsequent processing operations, such as etching. It should be noted that other masks, such as an oxide or silicon nitride mask, may also be used in the etching process.

In some other embodiments, the semiconductor fins 112 may be epitaxially grown. For example, exposed portions of an underlying material, such as an exposed portion of the substrate 110, may be used in an epitaxial process to form the semiconductor fins 112. A mask may be used to control the shape of the semiconductor fin 112 during the epitaxial growth process.

A plurality of isolation features 120, such as shallow trench isolation (STI), are formed in the substrate 110 to separate various devices. The formation of the isolation features 120 may include etching trenches in the substrate 110 and filling the trenches by insulator materials such as silicon oxide, silicon nitride, or silicon oxynitride. The filled trench may have a multi-layer structure such as a thermal oxide liner layer with silicon nitride filling the trench. In some embodiments, the isolation features 120 may be created using a process sequence such as: growing a pad oxide, forming a low pressure chemical vapor deposition (LPCVD) nitride layer, patterning an STI opening using photoresist and masking, etching a trench in the substrate 110, optionally growing a thermal oxide trench liner to improve the trench interface, filling the trench with CVD oxide, and using chemical mechanical planarization (CMP) to remove the excessive dielectric layers.

Figure 2:
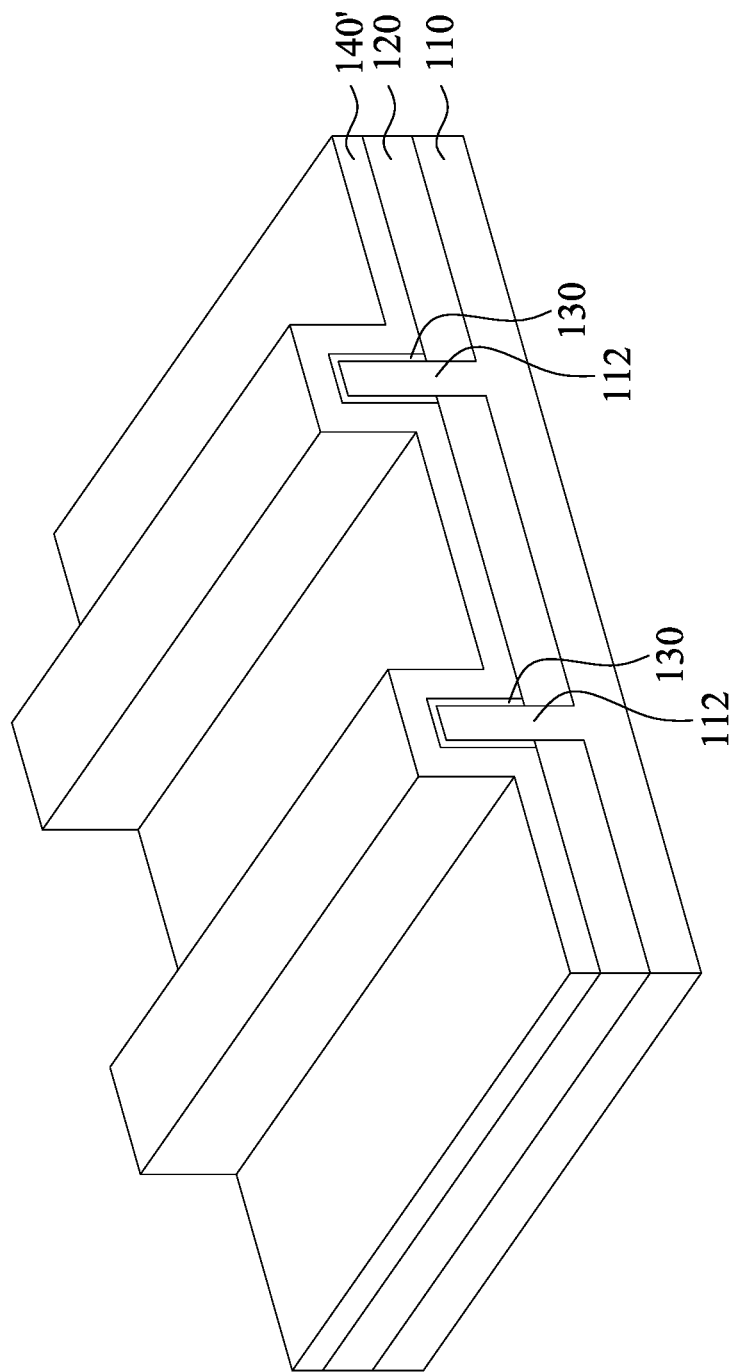

Reference is made to FIG. 2. Floating-gate dielectric films 130 are conformally formed to cover the semiconductor fins 112. In some embodiments, the floating-gate dielectric films 130 may include silicon dioxide, silicon nitride, a high-κ dielectric material or other suitable material. In various examples, the floating-gate dielectric films 130 may be formed using thermal oxide, chemical vapor deposition (CVD), physical vapor deposition (PVD), atomic layer deposition (ALD), ozone oxidation, other suitable processes, or combinations thereof. By way of example, the floating-gate dielectric films 130 may be used to prevent damage to the semiconductor fins 112 by subsequent processing (e.g., subsequent formation of the floating gate).

Then, a floating gate layer 140' is conformally formed over the floating-gate dielectric films 130. The floating gate layer 140' may include polysilicon formed through, for example low pressure CVD (LPCVD) methods, CVD methods and PVD sputtering methods employing suitable silicon source materials. If desired, the floating gate layer 140' may be ion implanted to the desired conductive type. It is to be appreciated other gate electrode material such as metal, metal alloys, single crystalline silicon, or combinations thereof.

Figure 3:
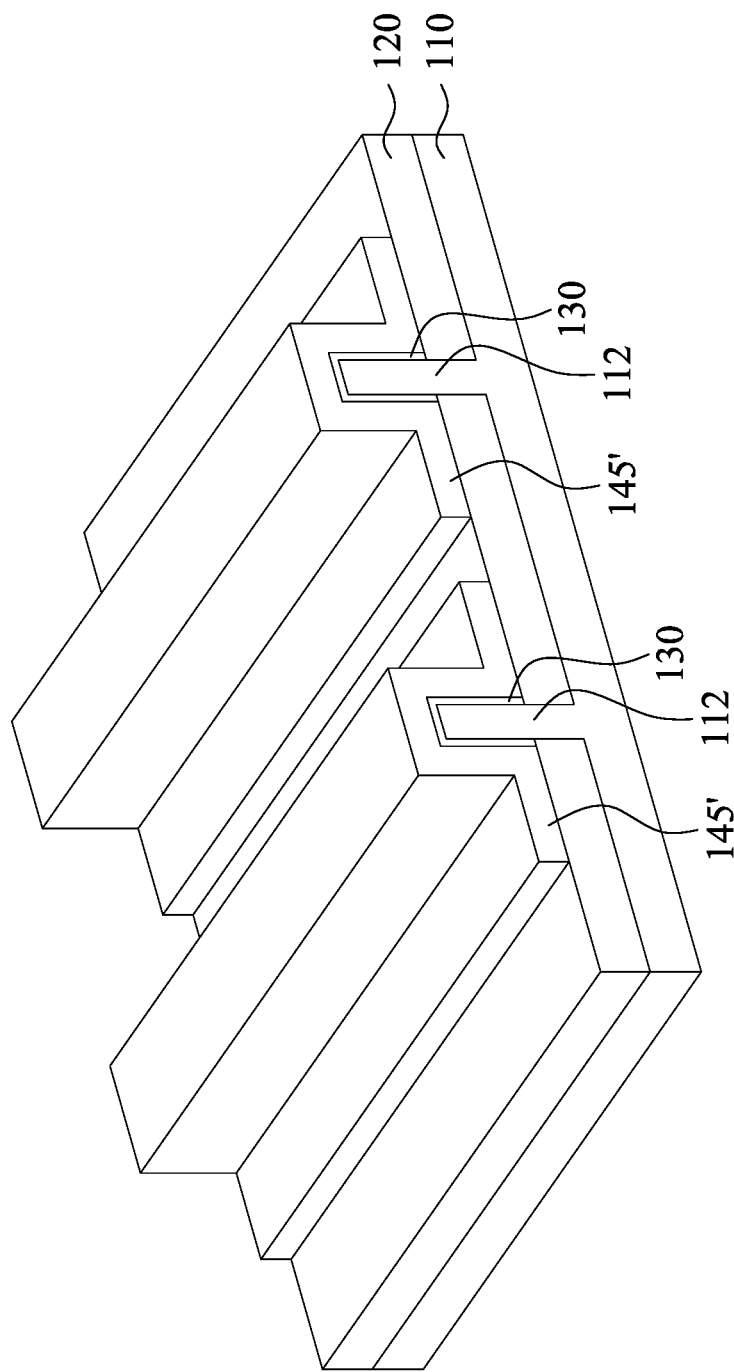

Reference is made to FIG. 3. The floating gate layer 140' in FIG. 2 is patterned to form floating gate layers 145'. In some embodiments, a layer of photoresist material (not shown) is deposited over the floating gate layer 140'. The layer of photoresist material is irradiated (exposed) in accordance with a desired pattern (the floating gate layers 145' in this case) and developed to remove a portion of the photoresist material. The remaining photoresist material protects the underlying material from subsequent processing steps, such as etching. It should be noted that other masks, such as an oxide or silicon nitride mask, may also be used in the etching process.

Figure 4:
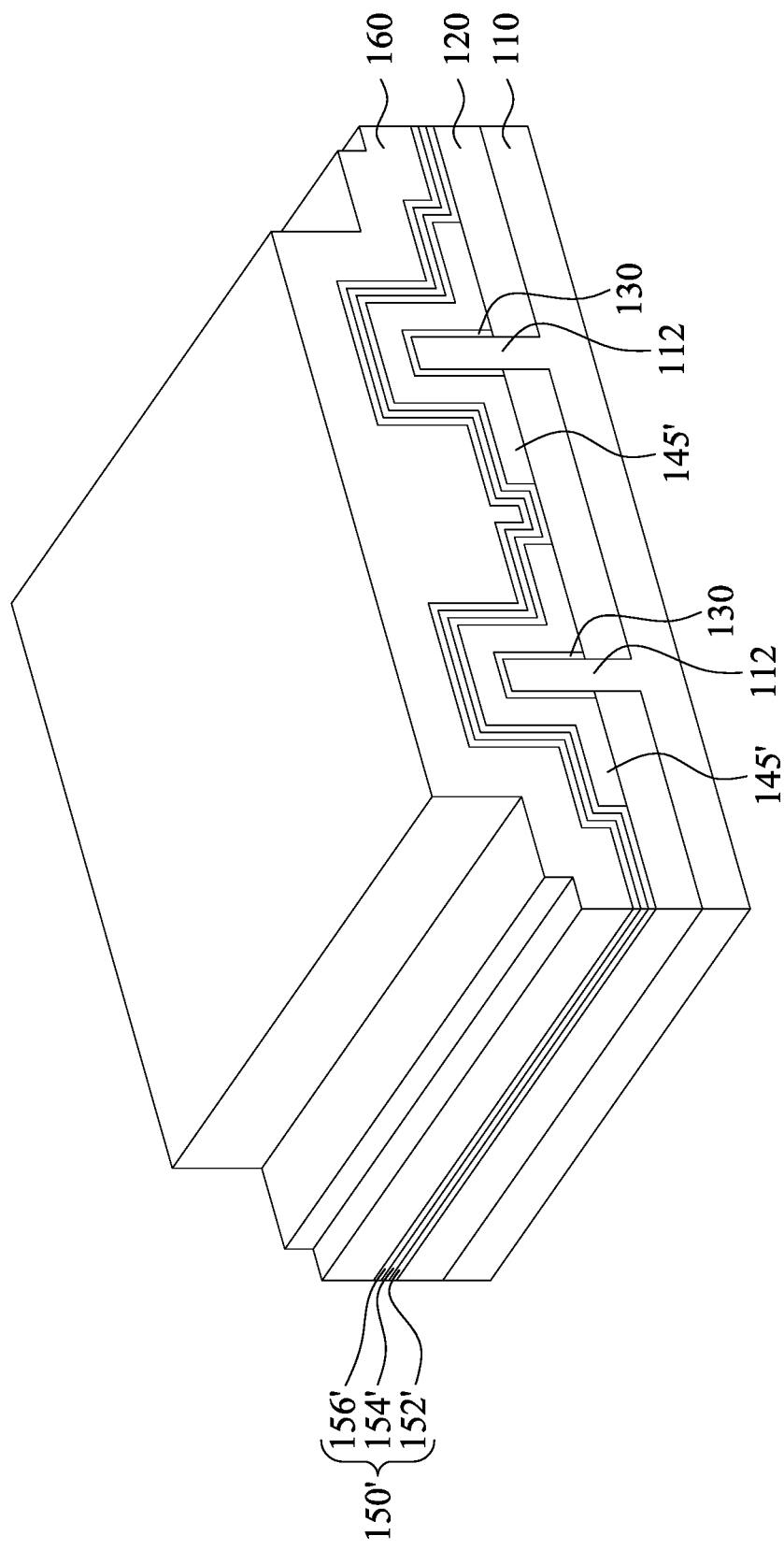

Reference is made to FIG. 4. A dielectric structure 150' is formed over the floating gate layers 145'. The dielectric structure 150' may include, for example, a dielectric material such as silicon dioxide ($SiO_2$), silicon nitride ($Si_3N_4$), oxynitrides (SiON), high-k materials, other non-conductive materials, or combinations thereof. In some embodiments, the dielectric structure 150' includes a bottom layer 152', a middle layer 154', and a top layer 156'. The middle layer 154' is above the bottom layer 152', and the top layer 156' is above the middle layer 154'. In some embodiments, the middle layer 154' is in contact with the bottom layer 152' and the top layer 156'. The bottom layer 152' and the top layer 156' may be oxide layers, and the middle layer 154' may be a nitride layer. For example, the bottom layer 152' and the top layer 156' may be made of silicon dioxide ($SiO_2$) and the middle layer 154' may be made of silicon nitride. The dielectric structure 150' may be formed using chemical vapor deposition (CVD), physical vapor deposition (PVD), atomic layer deposition (ALD), ozone oxidation, other suitable processes, or combinations thereof.

Then, a control gate layer 160 is formed over the dielectric structure 150'. The control gate layer 160 may include polysilicon formed through, for example low pressure CVD (LPCVD) methods, CVD methods and PVD sputtering methods employing suitable silicon source materials. If desired, the control gate layer 160 may be ion implanted to the desired conductive type. It is to be appreciated other gate electrode material such as metal, metal alloys, single crystalline silicon, or combinations thereof.

Figure 5:
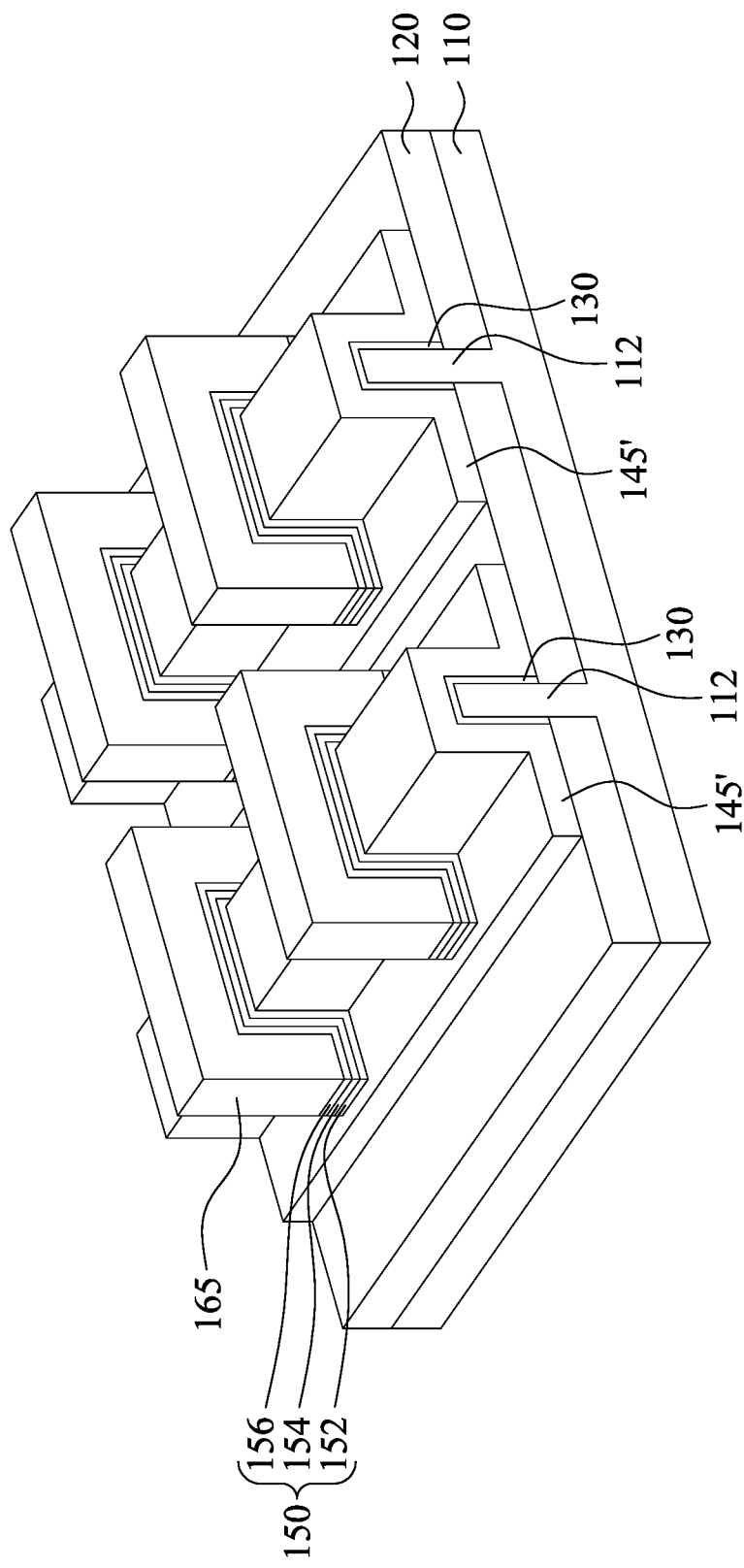

Reference is made to FIG. 5. The control gate layer 160 and the dielectric structure 150' of FIG. 5 are patterned to be control gates 165 and dielectric structures 150. The dielectric structures 150 are formed over the floating gate layer 145', and the control gates 165 are respectively formed over the dielectric structures 150. In some embodiments, each of the dielectric structures 150 includes a bottom layer 152, a middle layer 154, and a top layer 156 corresponding to the bottom layer 152', the middle layer 154', and the top layer 156' of FIG. 4.

Figure 6:
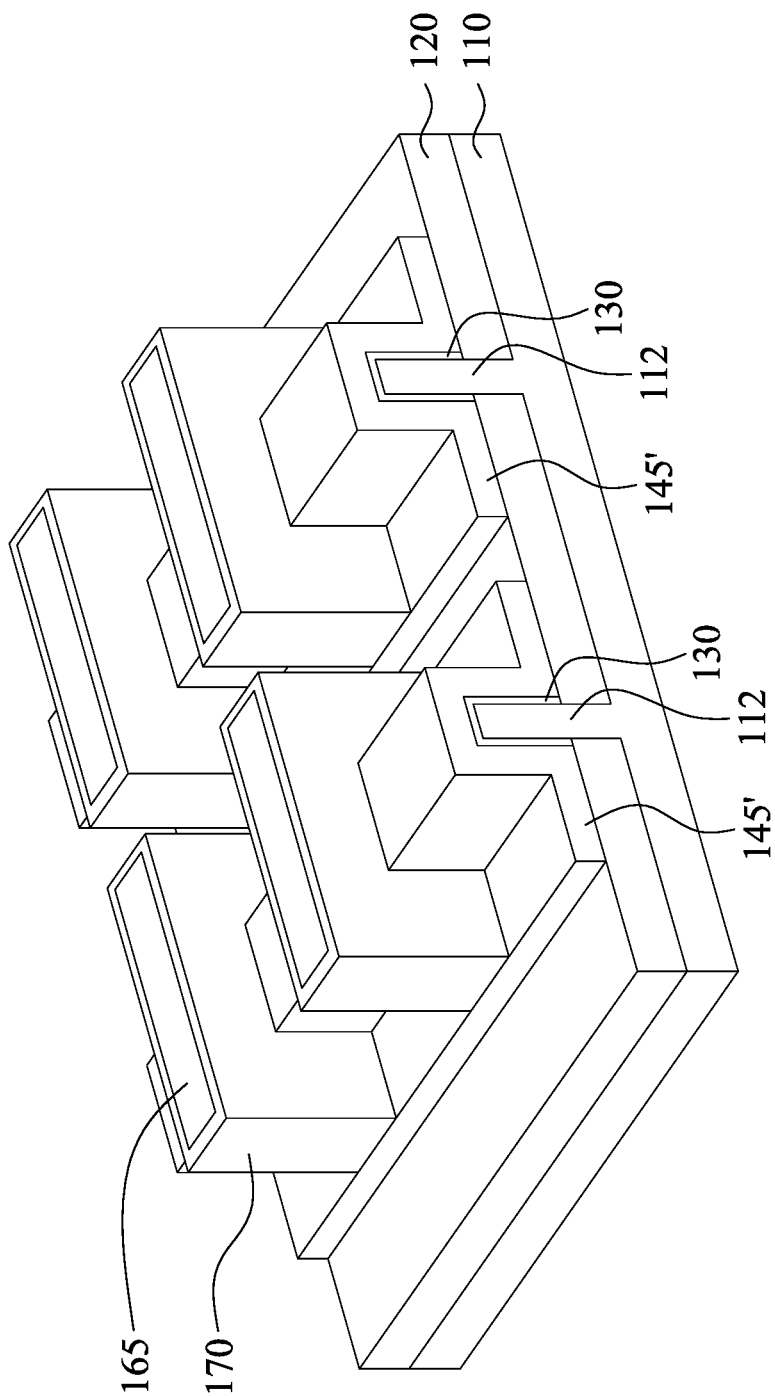

Reference is made to FIG. 6. Control-gate spacer structures 170 are formed on sidewalls of the dielectric structures 150 and the control gates 165. The control-gate spacer structures 170 are further above the floating gate layer 145'. In some embodiments, each of the control-gate spacer structures 170 is a dielectric layer, such as an oxide layer. The control-gate spacer structures 170 may be formed using a deposition method, such as plasma enhanced chemical vapor deposition (PECVD), low-pressure chemical vapor deposition (LPCVD), sub-atmospheric chemical vapor deposition (SACVD), or the like. The formation of the control-gate spacer structures 170 may include blanket forming spacer layers and then performing etching operations to remove the horizontal portions of the spacer layers. The remaining vertical portions of the spacer layers form the control-gate spacer structures 170.

Figure 7:
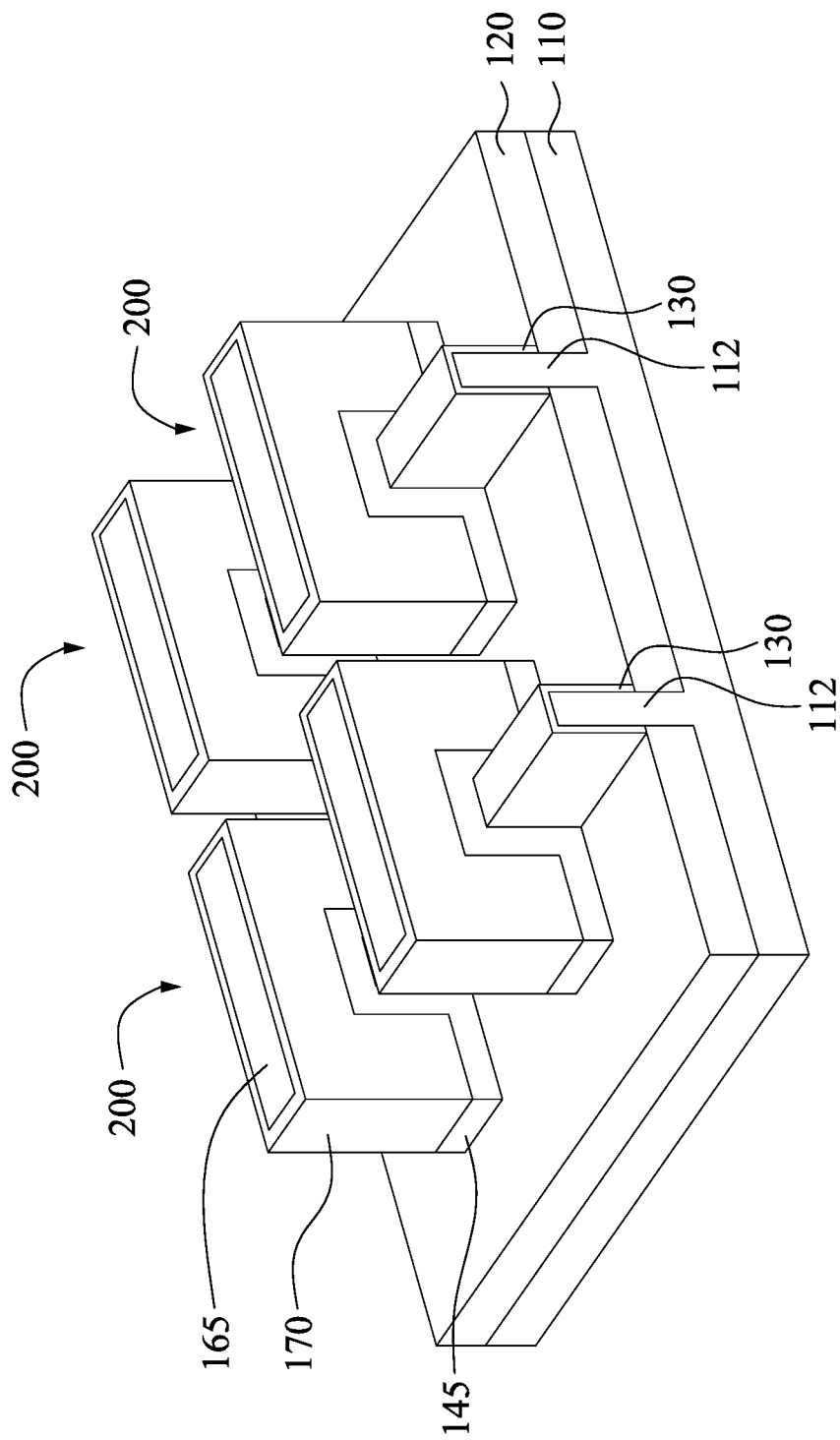

Reference is made to FIG. 7. The floating gate layers 145' in FIG. 7 are further patterned to form floating gates 145 respectively under the control gates 165. The etching of the floating gate layers 145' results in floating gates 145 to be separated from each other, wherein each of the floating gates 145 may be used for forming one flash memory cell 10 (see FIG. 14B). The etching of the floating gates 145 may be anisotropic, and may be stopped on the floating-gate dielectric layer 130 in some embodiments. Anisotropic etching means different etch rates in different directions in the material. That is, an anisotropic etching removes the material being etched at different rates in different directions. Furthermore, the etching of floating gates 145 may be a blanket etching without using a lithography mask. In FIG. 7, the floating gate 145, the dielectric structure 150, the control gate 165, and the spacer structure 170 are together referred to as a gate stack 200.

Figure 8:
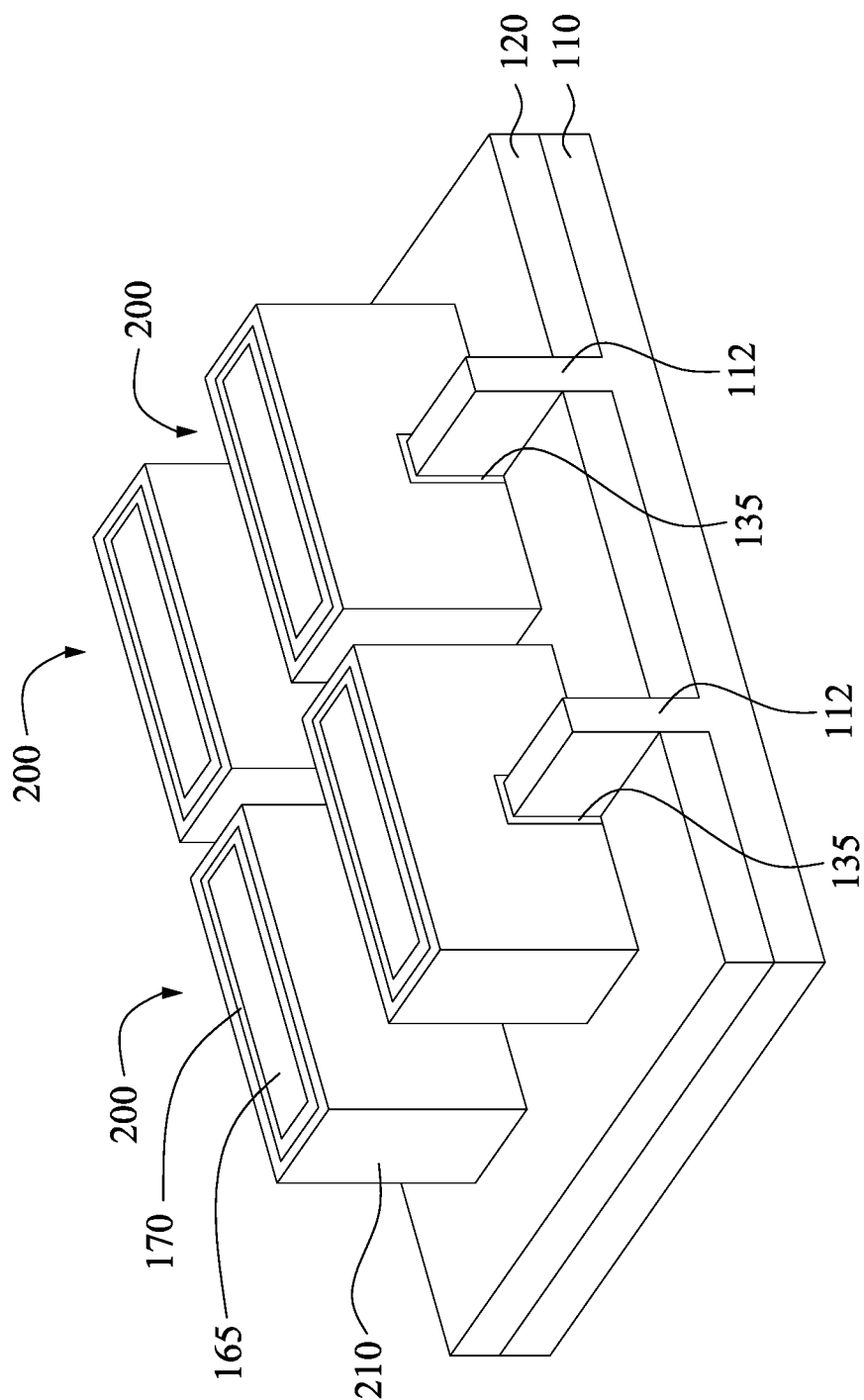

Reference is made to FIG. 8. Floating-gate spacer structures 210 are formed on opposite sides of the gate stacks 200. In some embodiments, the floating-gate spacer structures 210 are high temperature oxide layer or other suitable dielectric layers. In some embodiments, a dielectric film may be conformally formed over the structure of FIG. 7, and an etching process is performed to remove the horizontal portions of the dielectric film to form the dielectric layers 210. Then, the floating-gate dielectric films 130 are patterned using the gate stacks 200 and the floating-gate spacer structures 210 as masks to be floating-gate dielectric layers 135, such that portions of the semiconductor fins 112 are exposed.

Figure 9A:
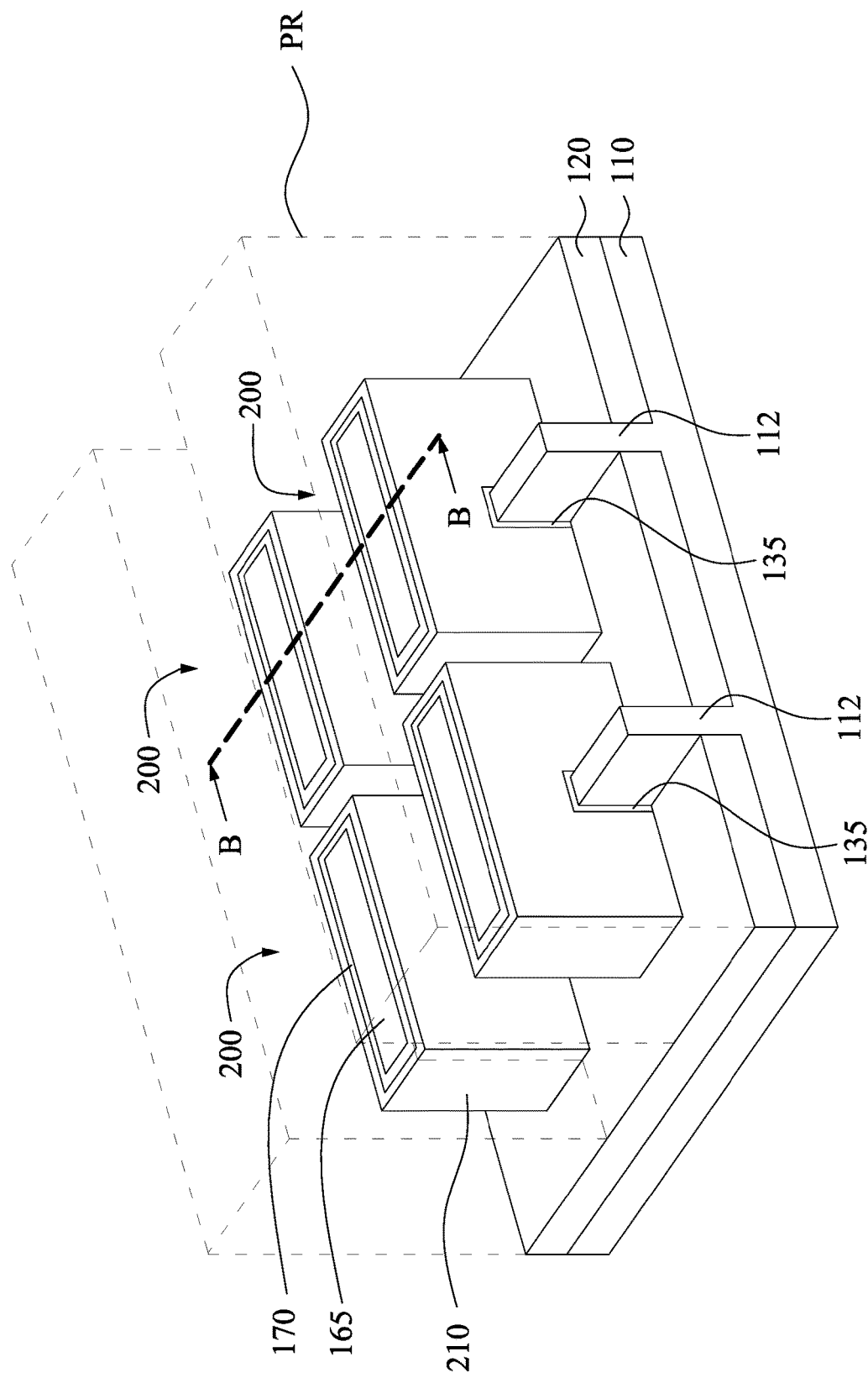
Figure 9B:
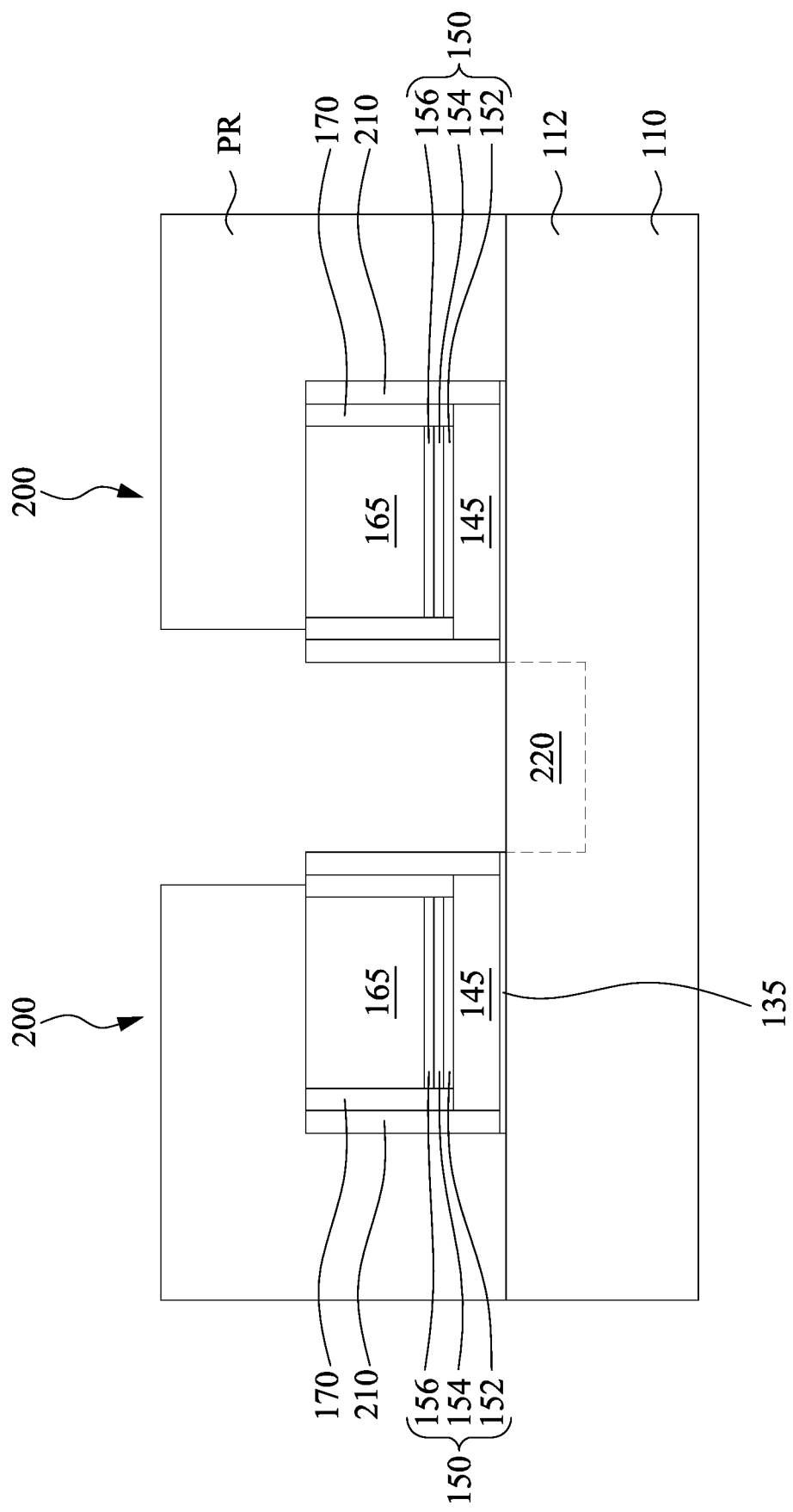

Reference is made to FIGS. 9A and 9B, where FIG. 9B is a cross-sectional view taking along line B-B of FIG. 9A. At least one common source region 220 is formed between two adjacent gate stacks 200. For example, a patterned photoresist layer PR is formed by a combination of spin coating, exposing and developing processes to expose areas of the semiconductor fins 112 between adjacent gate stacks 200. For clarity, the patterned photoresist layer PR in FIG. 9A is illustrated using dashed lines. The patterned photoresist layer PR may be formed by a photolithography process. Some exemplary photolithography processes may include processing operations of photoresist coating, soft baking, mask aligning, exposing, post-exposure baking, developing photoresist, and hard baking. The photolithography exposing process may also be implemented or replaced by other proper techniques such as maskless photolithography, electron-beam writing, ion-beam writing, and molecular imprint. In some embodiments, a bottom anti-reflective coating (BARC) layer may be formed prior to forming the patterned photoresist layer PR.

Subsequently, an implantation process is performed using the patterned photoresist layer PR as an implantation mask, so that the common source (CS) regions 220 are respectively formed in the semiconductor fins 112. The CS region 220 is shared by two memory cells 10 (see FIG. 14B). In some embodiments, the common source region 220 is a heavily doped n-type region, which may have an n-type impurity higher than about $10^{19}/cm^3$, for example.

Figure 10A:
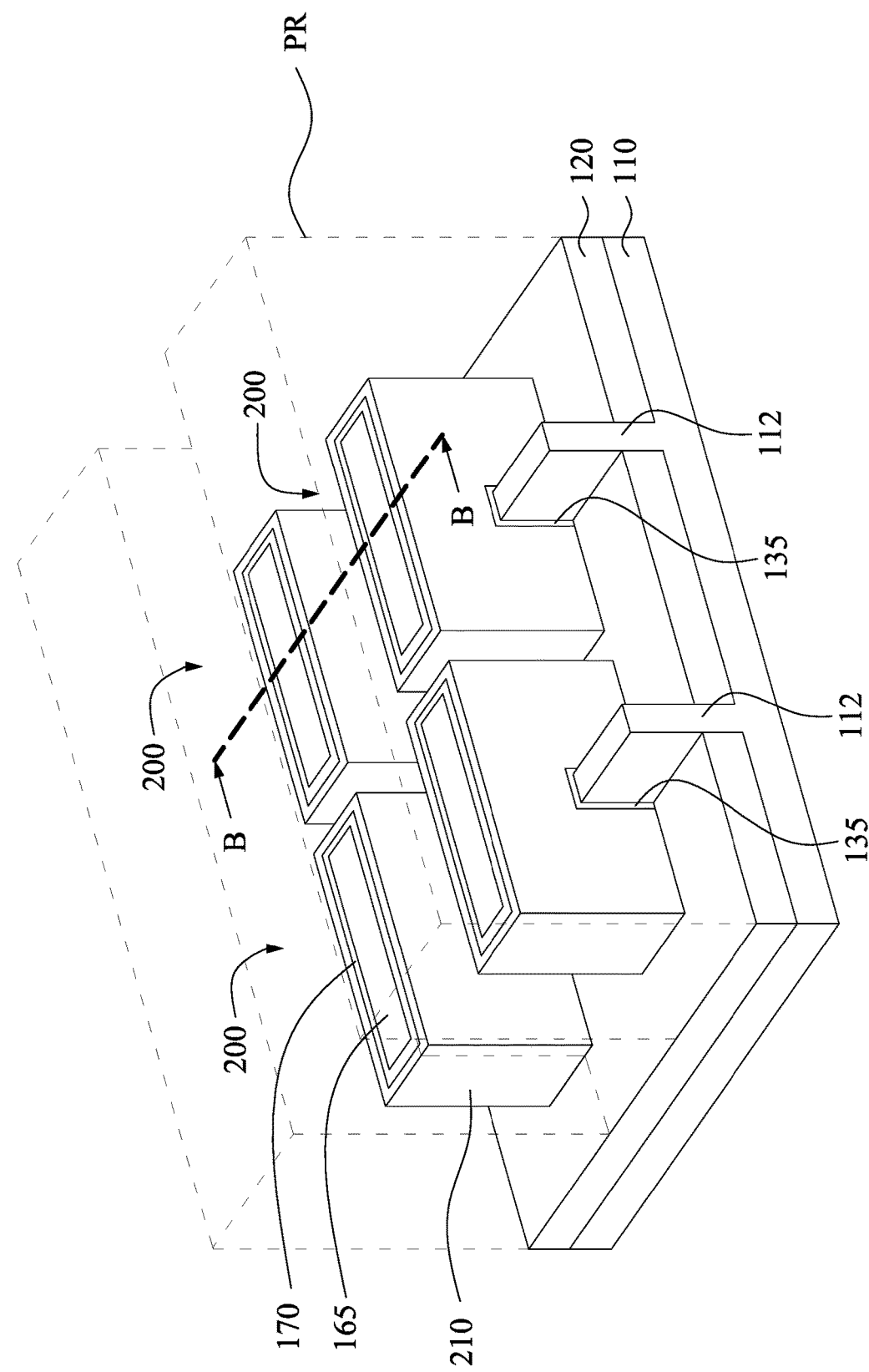
Figure 10B:
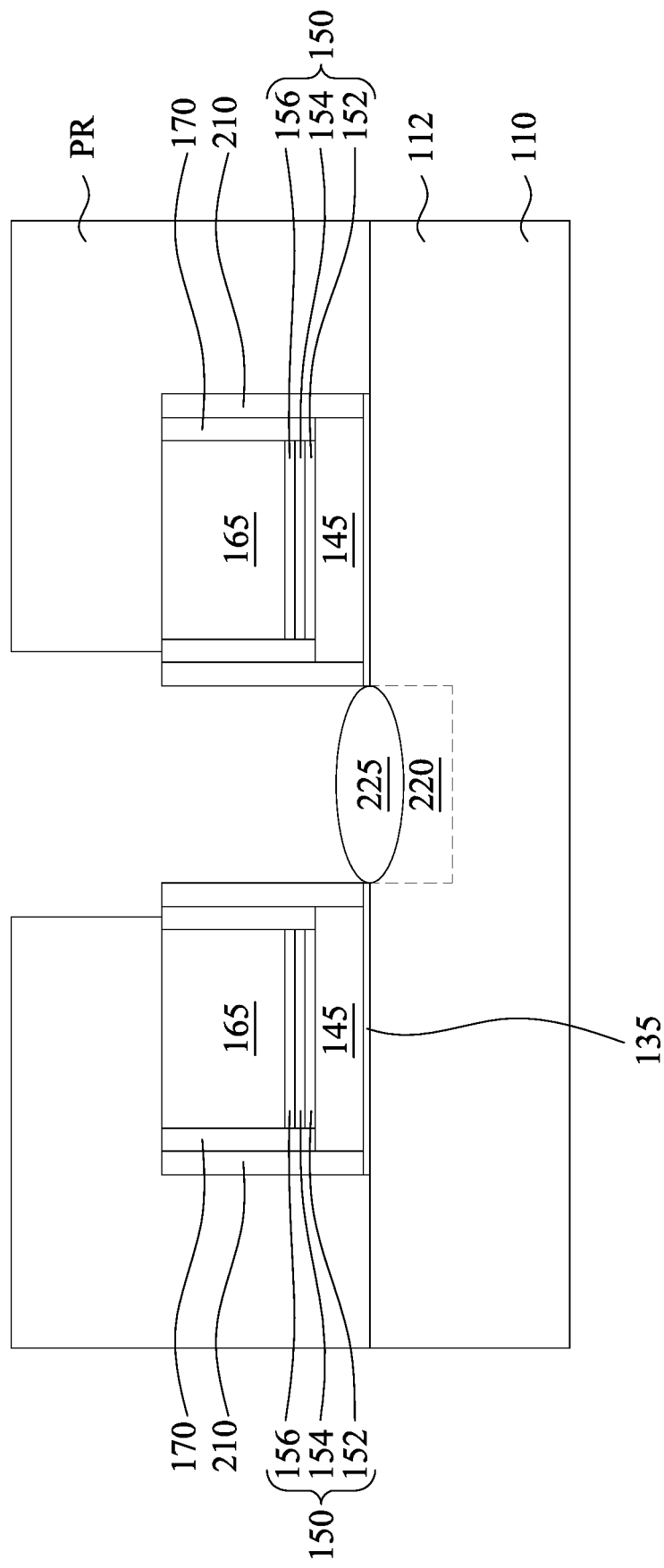

Reference is made to FIGS. 10A and 10B, where FIG. 10B is a cross-sectional view taking along line B-B of FIG. 10A. A common source (CS) dielectric layer 225 is formed over the CS region 220. The CS dielectric layer 225 may be a dielectric isolation structure and may be formed by oxidizing the semiconductor fin 112, other suitable processes, or combinations thereof. In some other embodiments, the CS dielectric layer 225 may be an oxide layer.

Figure 11A:
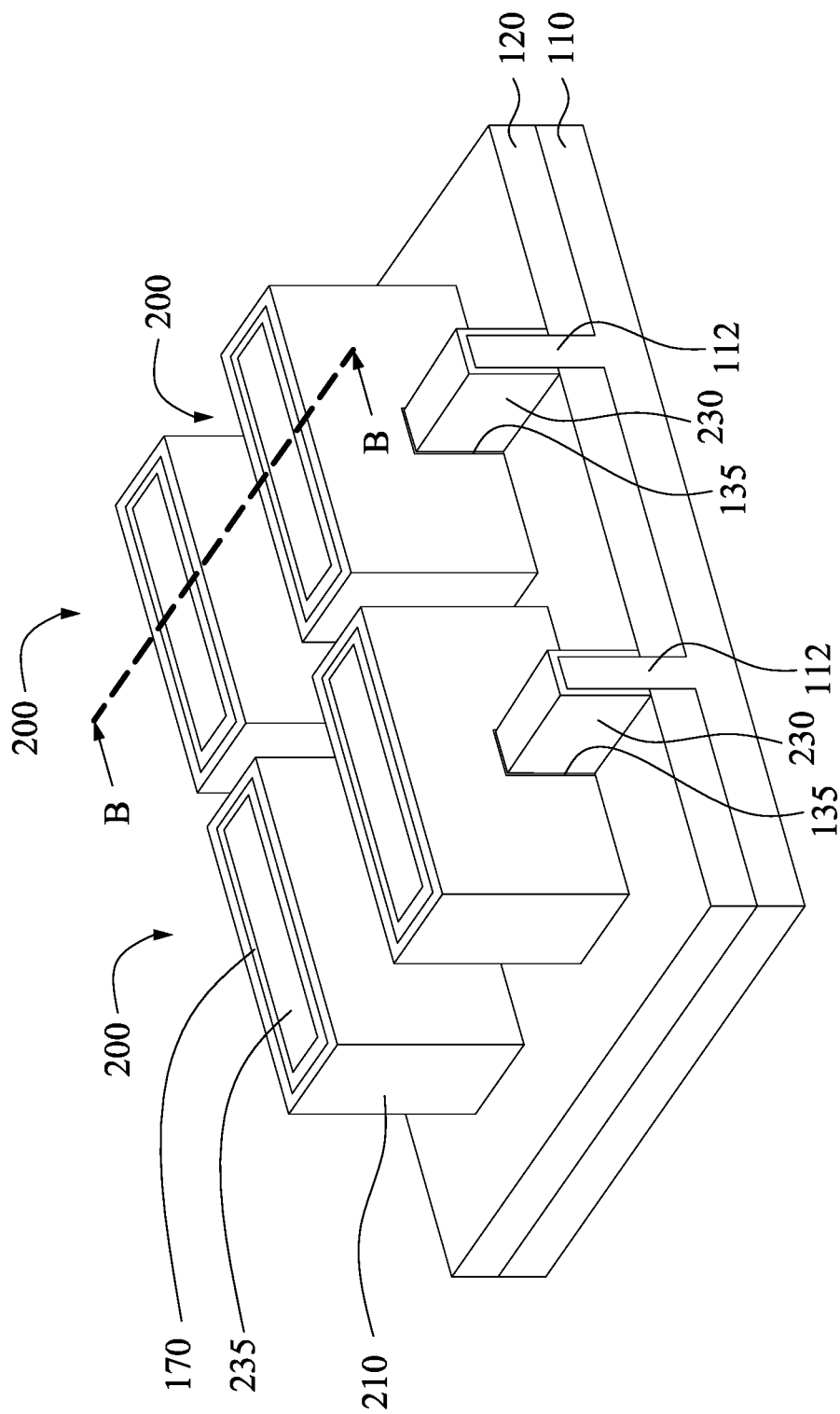
Figure 11B:
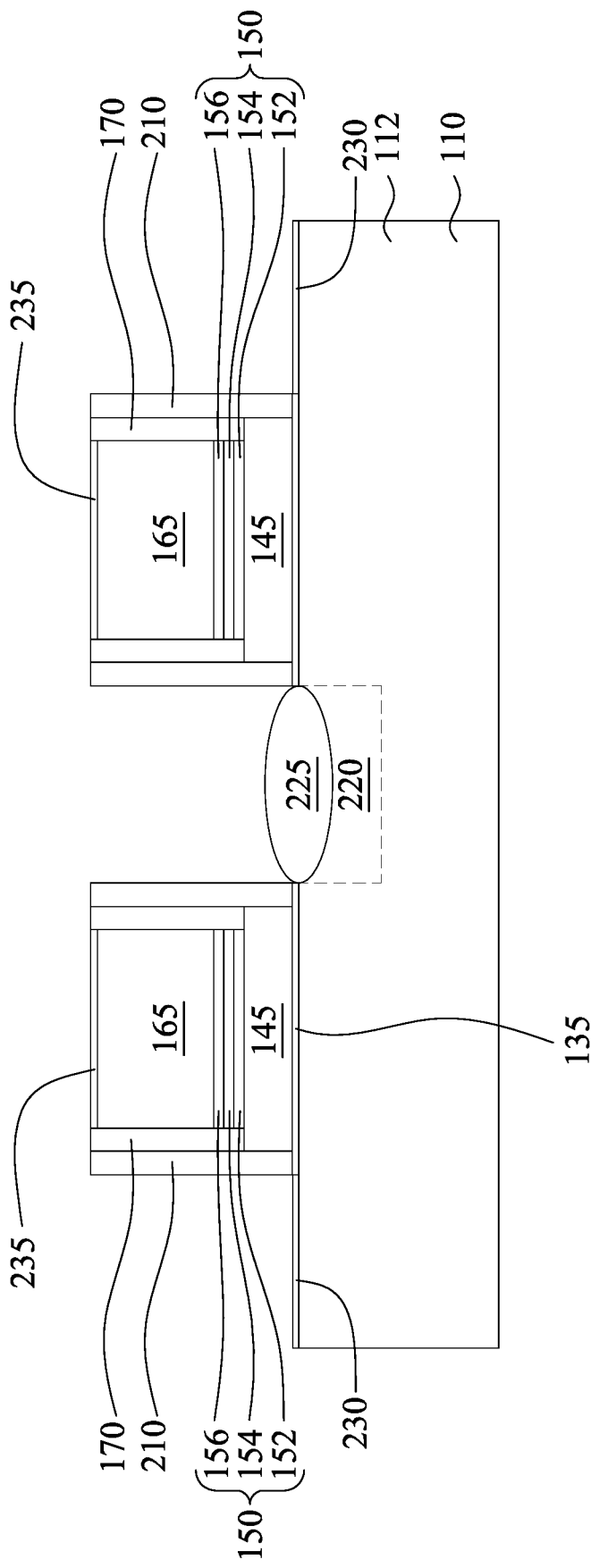

Reference is made to FIGS. 11A and 11B, where FIG. 11B is a cross-sectional view taking along line B-B of FIG. 11A. The patterned photoresist layer PR in FIGS. 10A and 10B is then removed, and the removal method may be performed by solvent stripping or plasma ashing, for example. Select-gate dielectric layers 230 are formed by oxidizing the semiconductor fins 112, such that the select-gate dielectric layers 230 may be oxide layers. Further, during oxidizing the semiconductor fins 112, the exposed surfaces of the control gates 165 may be also oxidized if the control gates 165 are made of polysilicon or other suitable materials, such that dielectric layers 235 are respectively formed to cover the control gates 165.

Figure 12:
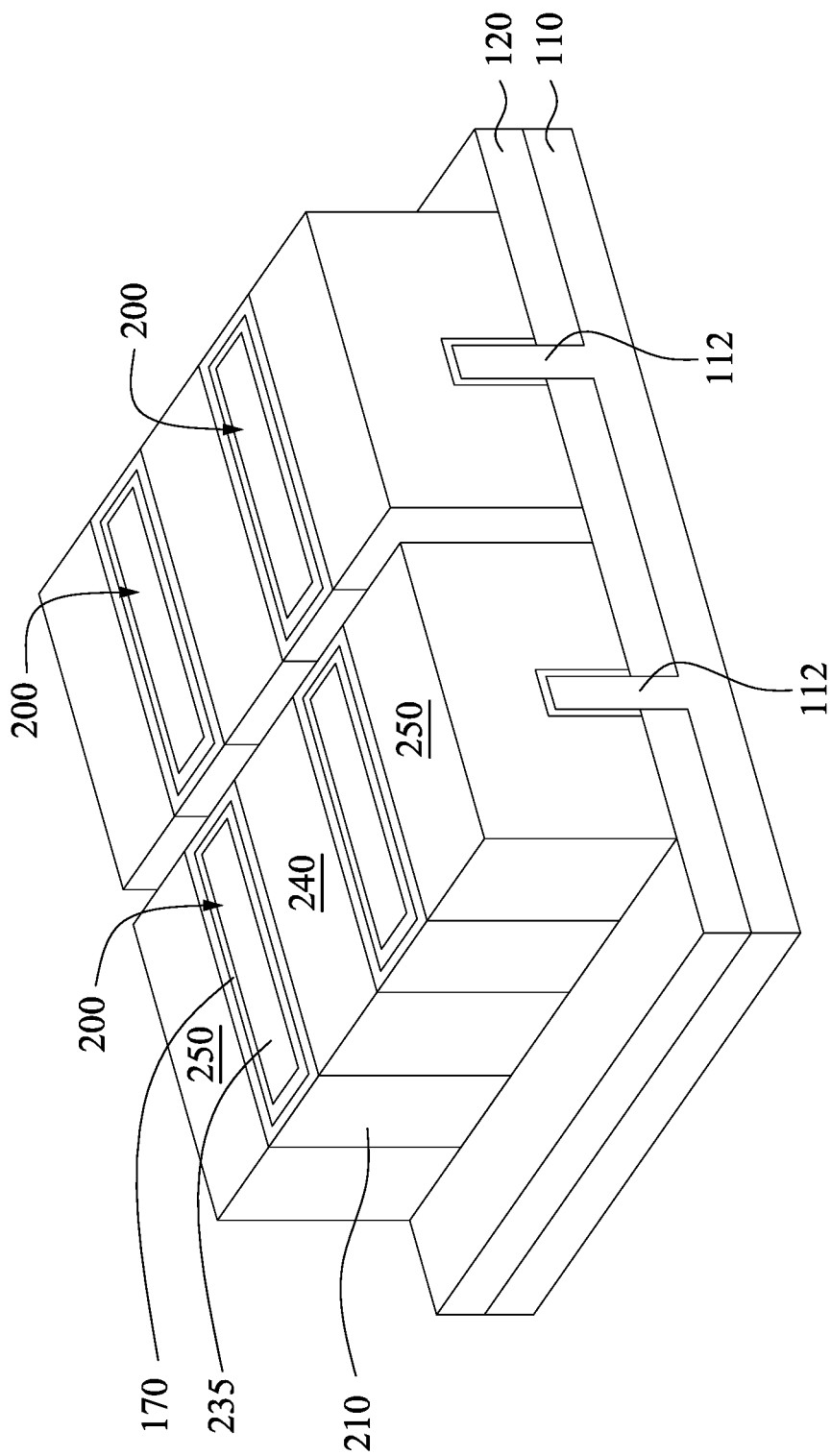

Reference is made to FIG. 12. A plurality of erase gates 240 and select gates (or word lines) 250 are respectively formed on opposite sides of the gate stacks 200. For example, a conductive layer is deposited over the substrate 110, and the conductive layer is planarized (or etched back) and then patterned. In some embodiments, top surfaces of the erase gates 240 and the select gates 250 are substantially coplanar with the dielectric layers 235. The erase gates 240 and the select gates 250 may include polysilicon formed through, for example low pressure CVD (LPCVD) methods, CVD methods and PVD sputtering methods employing suitable silicon source materials. If desired, the erase gates 240 and the select gates 250 may be ion implanted to the desired conductive type. It is to be appreciated other gate electrode material such as metal, metal alloys, single crystalline silicon, or combinations thereof.

Figure 13A:
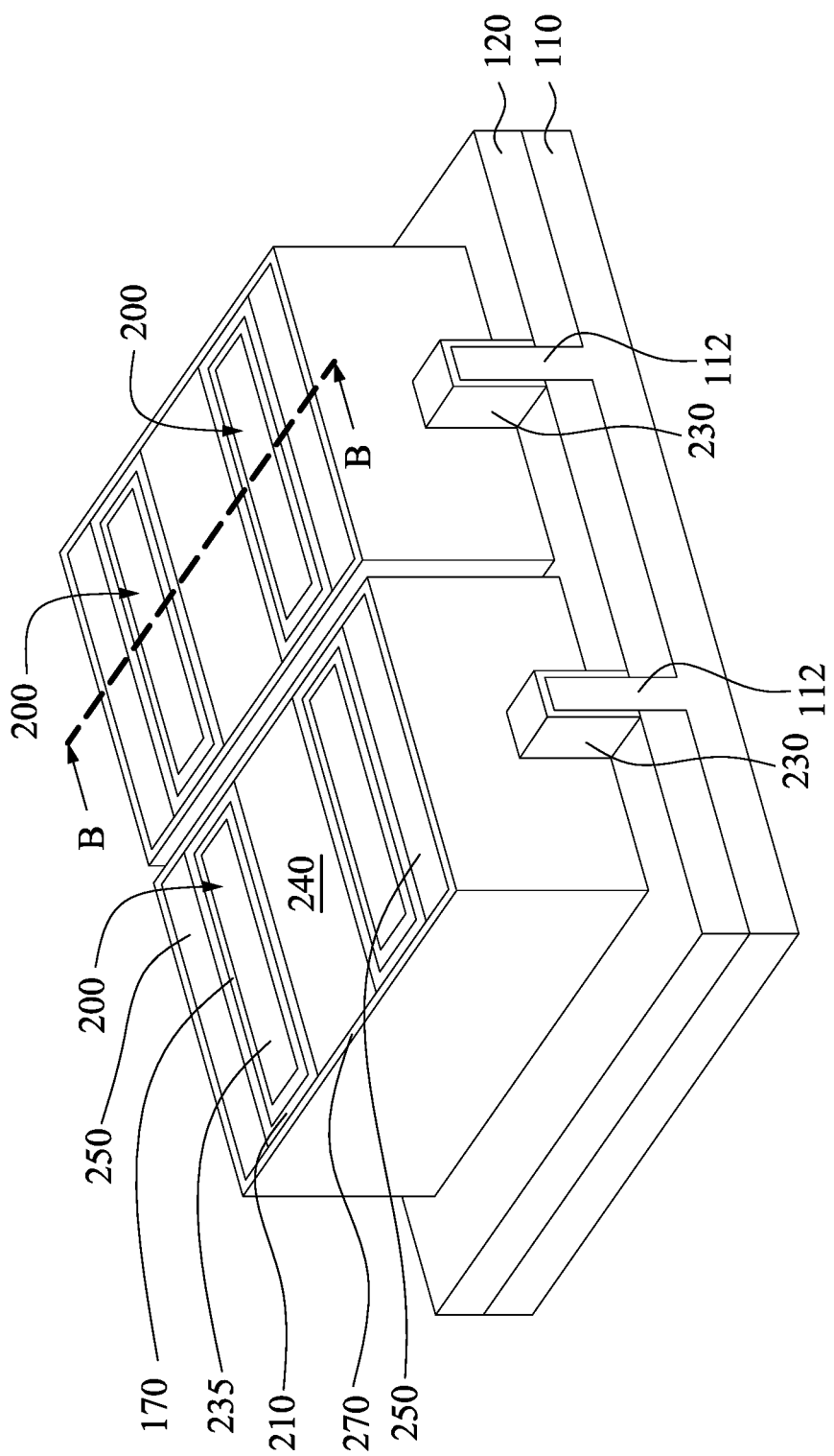
Figure 13B:
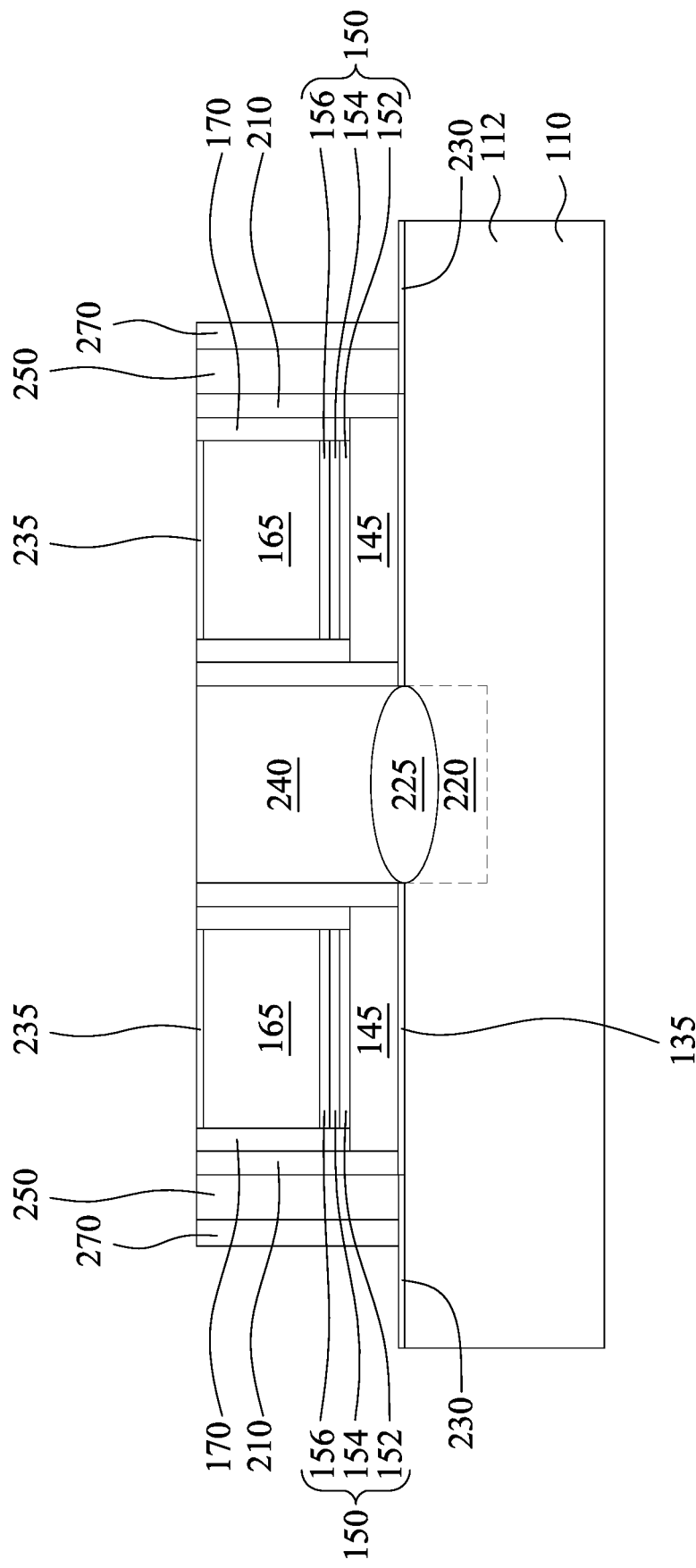

Reference is made to FIGS. 13A and 13B, where FIG. 13B is a cross-sectional view taking along line B-B of FIG. 13A. The select gates 250 are further patterned to expose portions of the select-gate dielectric layers 230. Then, a plurality of word-line spacer structures 270 are formed on sidewalls of the select gates 250, such that the select gate 250 is between the word-line spacer structure 270 and the gate stack 200. The word-line spacer structures 270 may be formed using a deposition method, such as plasma enhanced chemical vapor deposition (PECVD), low-pressure chemical vapor deposition (LPCVD), sub-atmospheric chemical vapor deposition (SACVD), or the like. The formation of the word-line spacer structures 270 may include blanket forming spacer layers and then performing etching operations to remove the horizontal portions of the spacer layers. The remaining vertical portions of the spacer layers form the word-line spacer structures 270. In some embodiments, portions of the word-line dielectric layers 230 not exposed by the word-line spacer structures 270 are removed as well, such that portions of the select-gate dielectric layers 230 are exposed. In some embodiments, the word-line spacer structures 270 may be multiple layers, e.g., oxide-nitride-oxide layers.

Figure 14A:
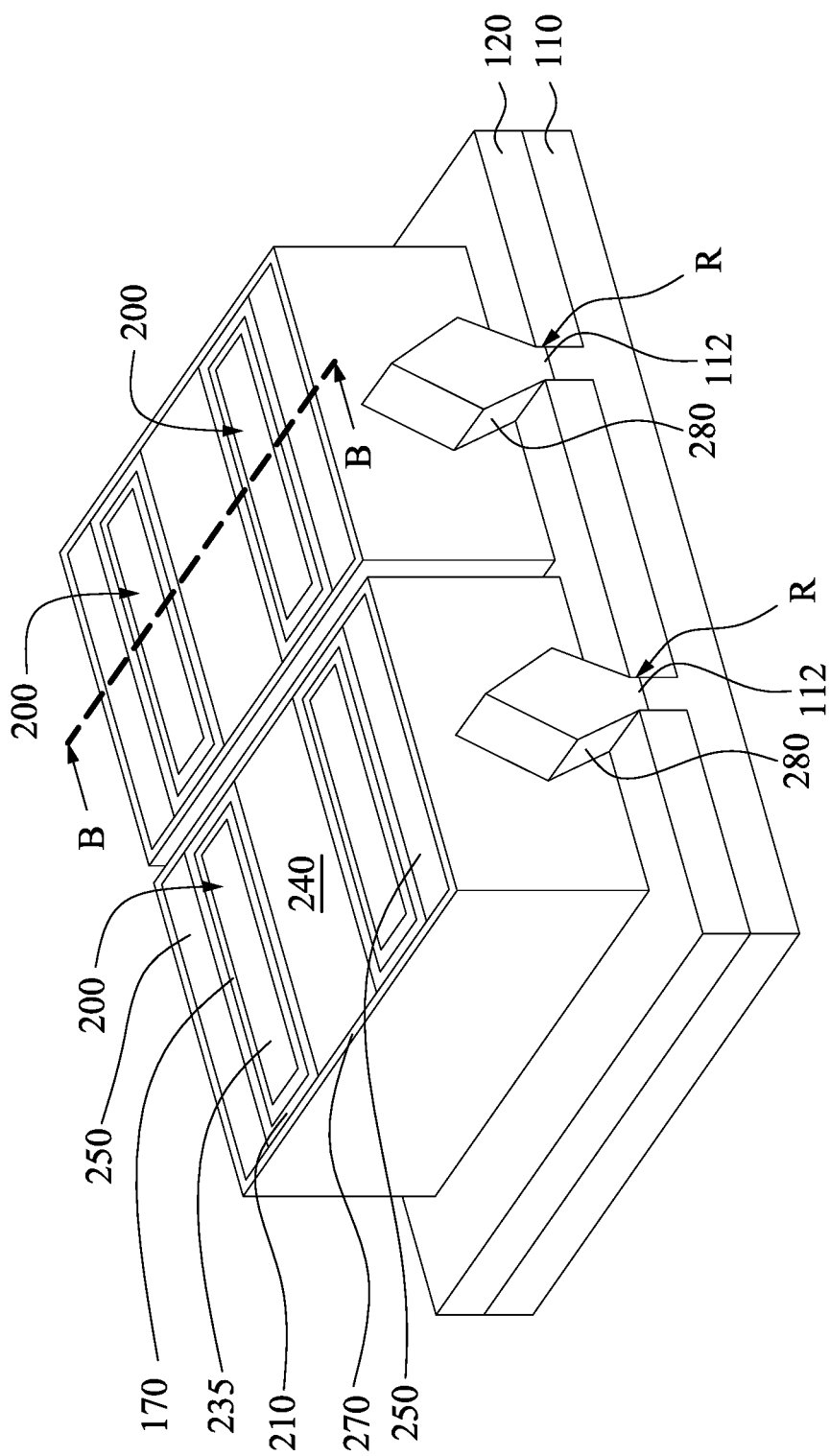
Figure 14B:
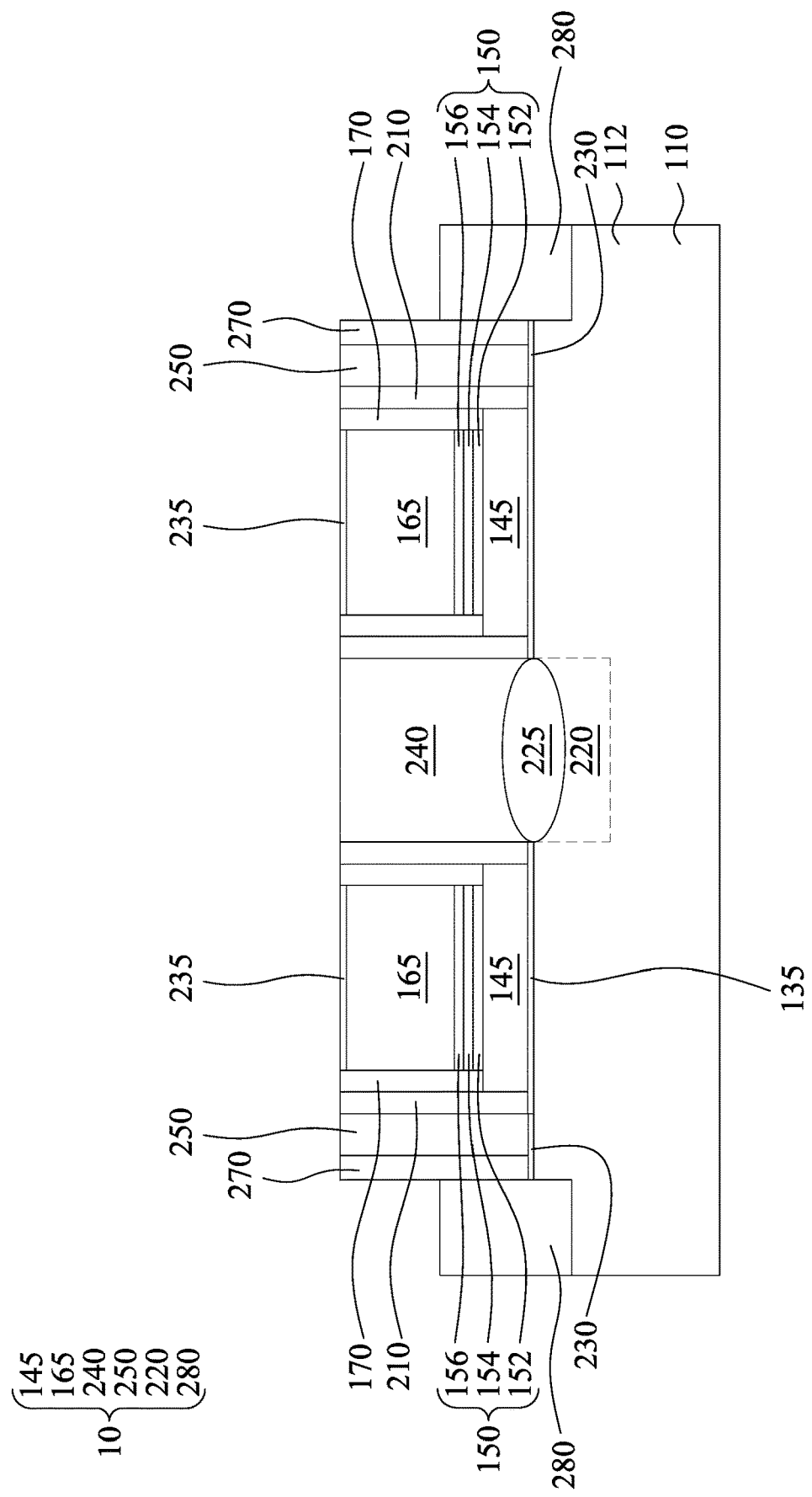

Reference is made to FIGS. 14A and 14B, where FIG. 14B is a cross-sectional view taking along line B-B of FIG. 14A. A plurality of recesses R are formed in the semiconductor fins 112 by etching the semiconductor fins 112. The gate stacks 200, the erase gates 240, the select gates 250, and the spacer structures act as etching masks in the formation of the recesses R. The etching process includes a dry etching process, a wet etching process, or combinations thereof. For example, the etching process utilizes a combination dry and wet etching. The etching gas may be a single-etching step or may include a plurality of etching operations.

Then, a semiconductor material is deposited in the recesses R to form epitaxy structures 280 which are referred to as drain features. The epitaxial structures 280 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxial structures 280 have suitable crystallographic orientations (e.g., a (100), (110), or (111) crystallographic orientation). In some embodiments, the epitaxial structures 280 include source/drain epitaxial structures. In some embodiments, where an N-type device is desired, the epitaxial structures 280 may include an epitaxially growing silicon phosphorus (SiP) or silicon carbon (SiC). In some embodiments, where a P-type device is desired, the epitaxial structures 280 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

As such, a plurality of memory cells 10 are formed. At least one of the memory cells 10 includes the floating gate 145, the control gate 165, the erase gate 240, the select gate 250, the CS region 220, and the drain region (i.e., the epitaxial structure) 280. Two adjacent (mirrored) memory cells 10 share one source region 220.

Figure 15:
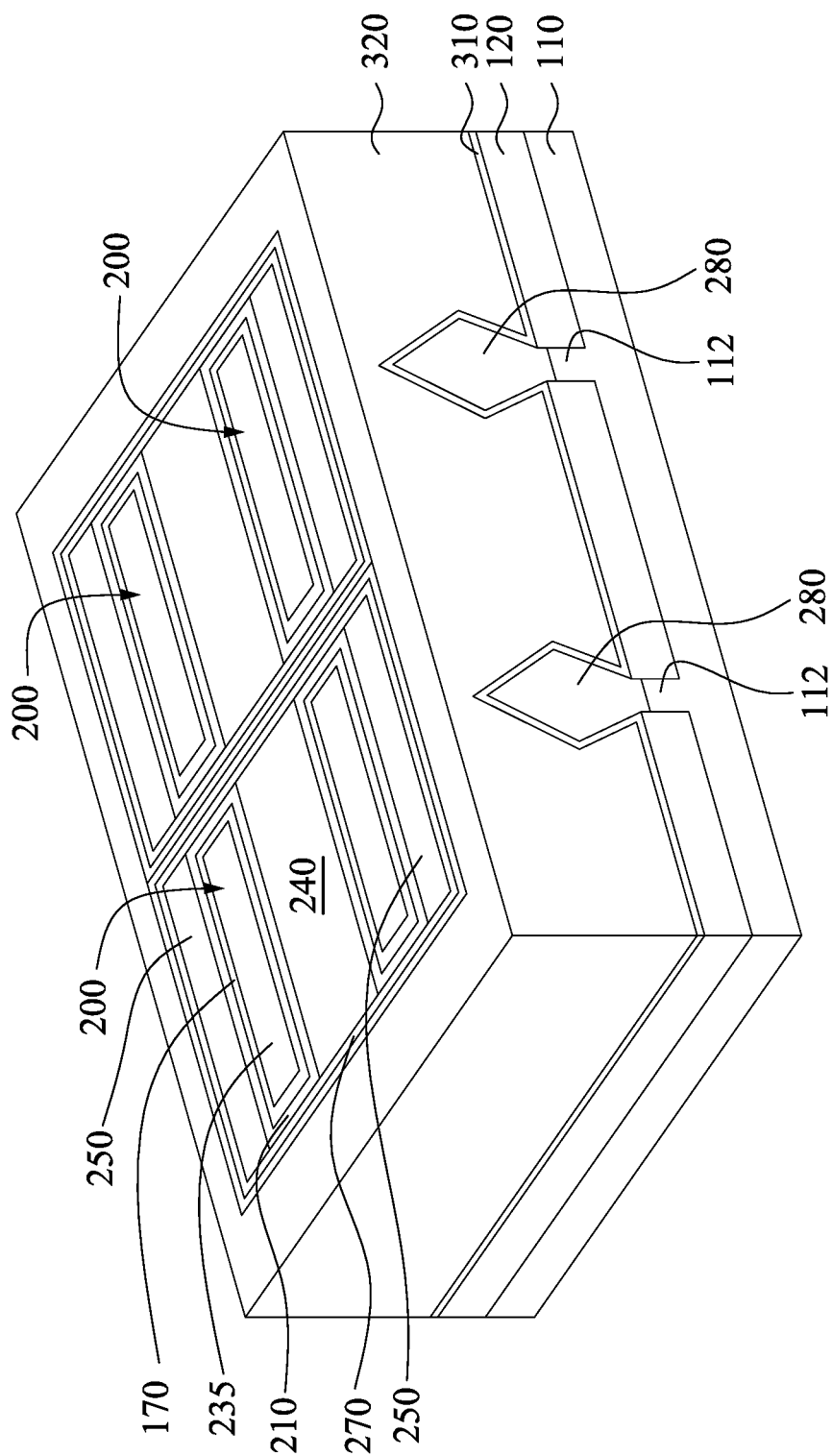

Reference is made to FIG. 15. An etching stop layer 310 is conformally formed over the structure of FIGS. 14A and 14B, and an interlayer dielectric (ILD) 320 is formed over the etching stop layer 310. In some embodiments, the etching stop layer 310 is a stressed layer or layers. In some embodiments, the etching stop layer 310 has a tensile stress and is formed of $Si_3N_4$. In some other embodiments, the etching stop layer 310 includes materials such as oxynitrides. In yet some other embodiments, the etching stop layer 310 may have a composite structure including a plurality of layers, such as a silicon nitride layer overlying a silicon oxide layer. The etching stop layer 310 may be formed using plasma enhanced CVD (PECVD), however, other suitable methods, such as low pressure CVD (LPCVD), atomic layer deposition (ALD), and the like, can also be used. The ILD 320 may be formed by chemical vapor deposition (CVD), high-density plasma CVD, spin-on, sputtering, or other suitable methods. In some embodiments, the ILD 320 includes silicon oxide. In some other embodiments, the ILD 320 may include silicon oxy-nitride, silicon nitride, or a low-k material. Then, a chemical mechanical polish (CMP) process is performed to level the top surface of the ILD 320 with the top surfaces of the erase gates 240 and the select gates 250.

Figure 16A:
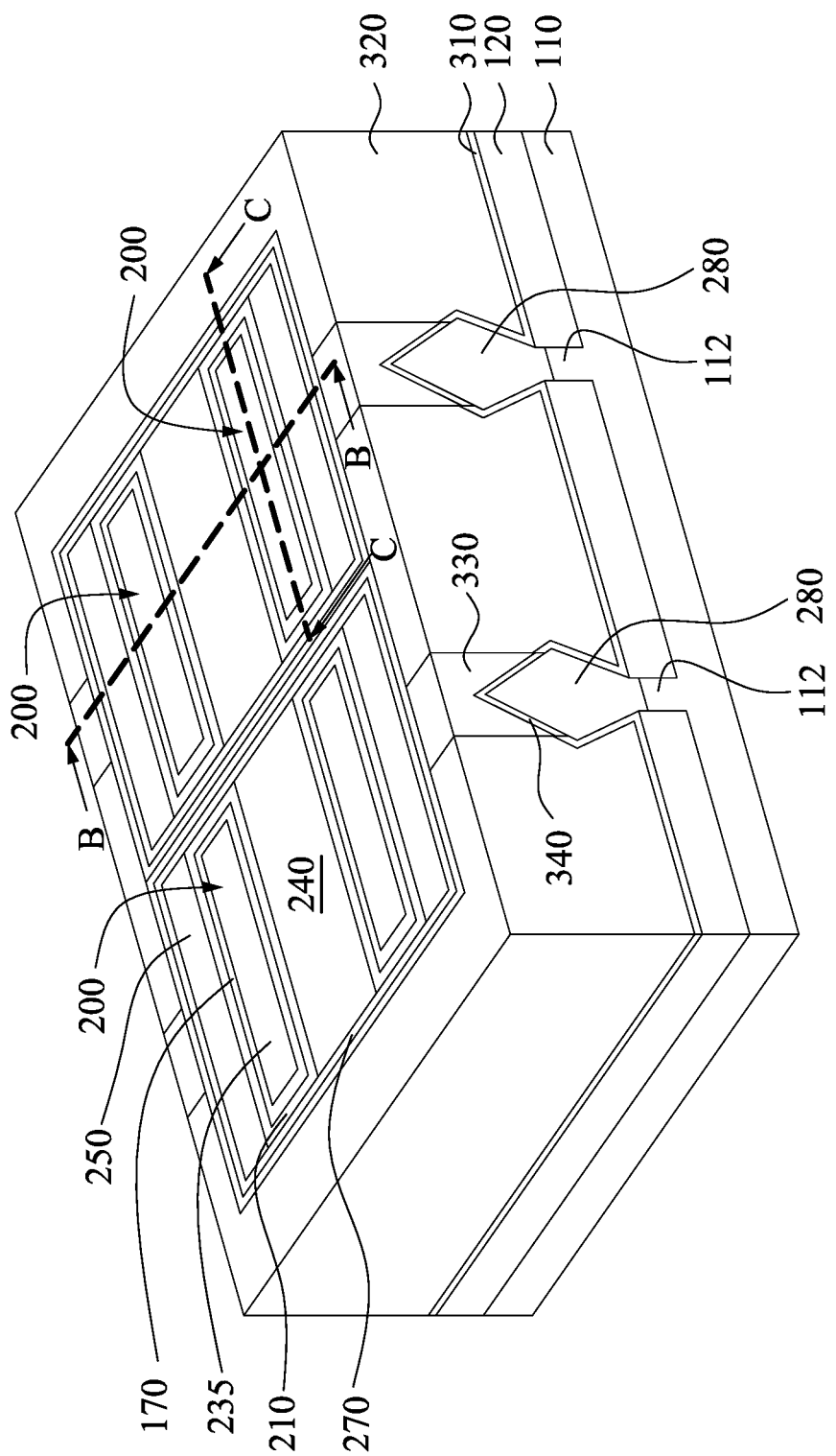
Figure 16B:
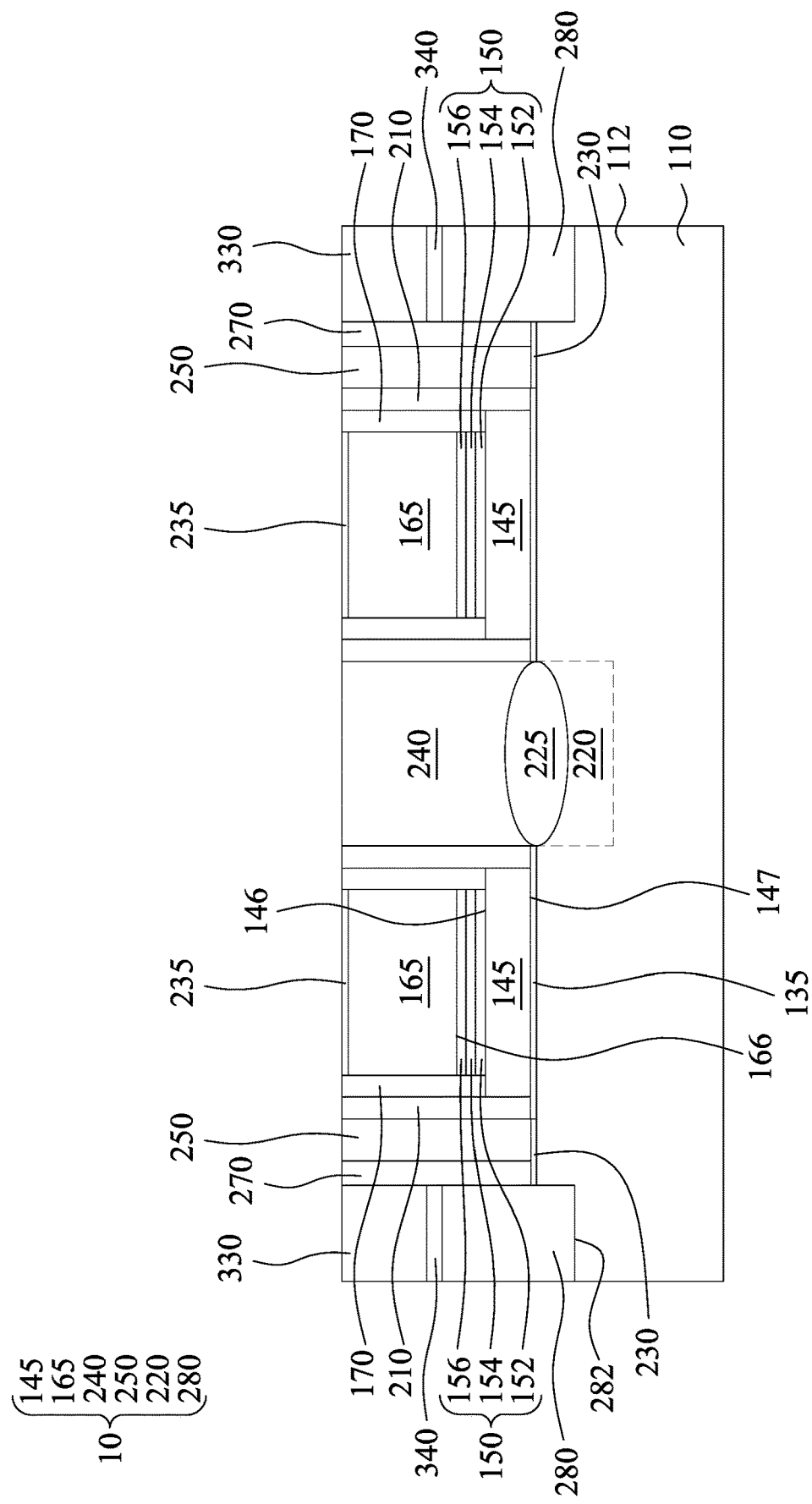
Figure 16C:
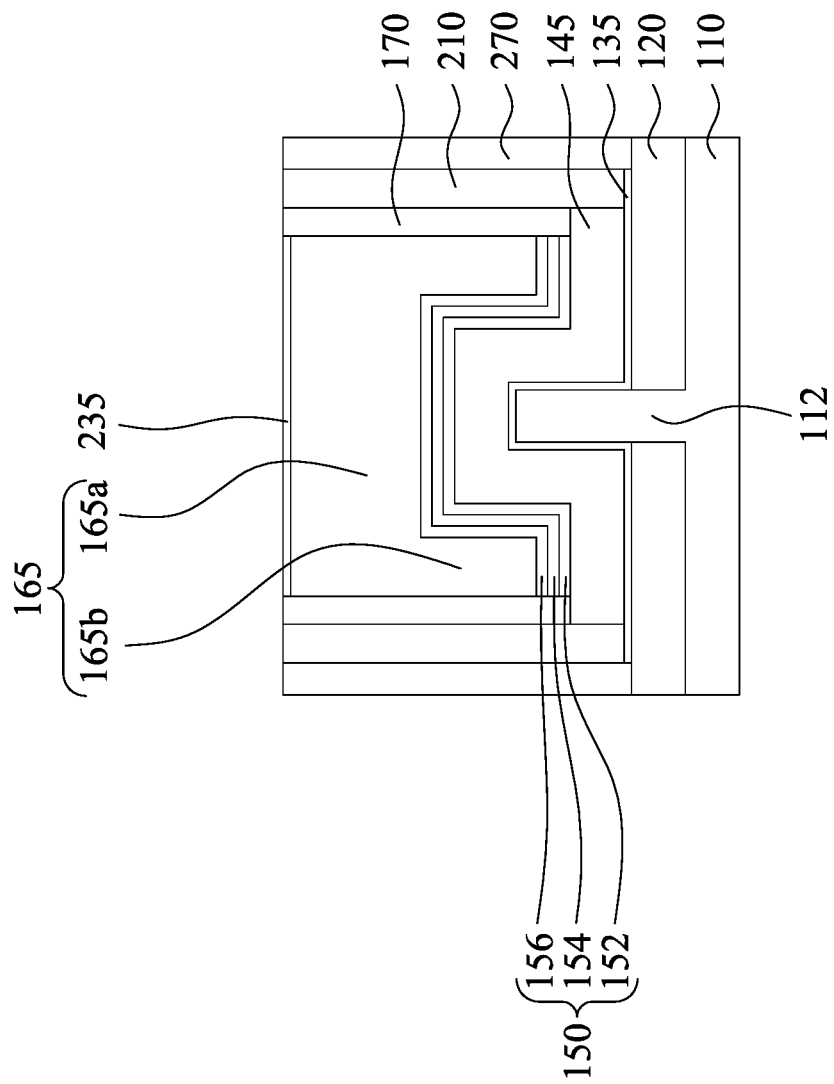

Reference is made to FIGS. 16A-16C, where FIG. 16B is a cross-sectional view taking along line B-B of FIG. 16A, and FIG. 16C is a cross-sectional view taking along line C-C of FIG. 16A. A plurality of contacts 330 are formed over the drain regions 280. For example, a plurality of the openings are formed in the ILD 320, and conductive materials are filled in the openings. The excess portions of the conductive materials are removed to form the contacts 330. The contacts 330 may be made of tungsten, aluminum, copper, or other suitable materials.

In some embodiments, a plurality of metal alloy layers 340 are respectively formed over the drain regions 280. For example, a metal layer is formed over the drain regions 280, and an annealing process is performed on the metal layer to form the metal alloy layers 340. The annealing process is also referred to as a silicide process if the epitaxial structures 280 are made of silicon. The silicide process converts the surface portions of the epitaxial structures 280 into silicide contacts (i.e., the metal alloy layer 340 in this case). Silicide processing involves deposition of a metal material that undergoes a silicidation reaction with silicon (Si). In order to form silicide contacts on the epitaxial structures 280, the metal layer is blanket deposited on the exposed surfaces of the epitaxial structures 280. After heating the wafer to a temperature at which the metal reacts with the silicon of the epitaxial structures 280 to form contacts, unreacted metal is removed. The silicide contacts remain over the epitaxial structures 280, while unreacted metal is removed from other areas. In some embodiments, the metal alloy layers 340 may be made of NiSi or other suitable materials. Then, the contacts 330 are respectively formed above the metal alloy layers 340.

In FIGS. 16A and 16B, each of the memory cells 10 includes a floating gate 145, a control gate 165, an erase gate 240, a select gate 250, a source region 220 formed in a semiconductor fin 112, and a drain region (i.e., the epitaxial structure 280 in this case). The floating gate 145 is formed above the semiconductor fin 112, the floating-gate dielectric layer 135 is between the floating gate 145 and the semiconductor fin 112. A dielectric structure 150' is between the floating gate 145 and the control gate 165. A dielectric layer 235 covers the control gate 165. A control-gate spacer structure 170 surrounds the control gate 165, the dielectric layer 235, and the dielectric structure 150. The control-gate spacer structure 170 is in contact with the control gate 165, the dielectric layer 235, the dielectric structure 150, and the floating gate 145. A floating-gate spacer structure 210 surrounds the control-gate spacer structure 170 and the floating gate 145. The floating-gate spacer structure 210 is in contact with the control-gate spacer structure 170, the floating gate 145, and the floating-gate dielectric layer 135. A CS dielectric layer 225 is between the erase gate 240 and the CS region 220. The erase gate 240 is in contact with the floating-gate spacer structure 210, the CS dielectric layer 225, and the isolation structures 120. The select gate 250 is surrounded by a word-line spacer structure 270 and the floating-gate spacer structure 210. The select gate 250 is in contact with the isolation structure 120. The word-line spacer structure 270 is in contact with the select gate 250 and the erase gate 240. A select-gate dielectric layer 230 is between the select gate 250 and the semiconductor fin 112 and between the word-line spacer structure 270 and the semiconductor fin 112. The epitaxial structure 280 is formed in the semiconductor fin 112 and protrudes from the semiconductor fin 112. The epitaxial structure 280 is in contact with the word-line spacer structure 270. A bottom surface 282 of the epitaxial structure 280 is lower than a bottom surface 147 of the floating gate 145. A contact 330 is above the epitaxial structure 280, and a metal alloy layer 340 is formed between the epitaxial structure 280 and the contact 330. Thus, the metal alloy layer 340 is in contact with the In FIG. 16B, the metal alloy layer 340 is at a level higher than a top surface 146 of the floating gate 145. In some embodiments, the metal alloy layer 340 is at a level higher than a bottom surface 166 of the control gate 165.

In FIGS. 16A and 16C, the floating-gate dielectric layer 135 is conformal to the semiconductor fin 112. The floating gate 145 is conformal to the floating-gate dielectric layer 135 and the semiconductor fin 112. The dielectric structure 150 is conformal to the floating gate 145 and the semiconductor fin 112. The control gate 165 includes a first portion 165a and a second portion 165b adjacent the first portion. The first portion 165a is right above the semiconductor fin 112 and the second portion 165b is right above the isolation structure 120. The first portion 165a is thinner than the second portion 165b.

In FIGS. 16A-16C, the memory cells 10 are formed above the semiconductor fins 112, such that a layout area of the memory cells 10 can be reduced, e.g., about 30%. Furthermore, the semiconductor fins 112 of the memory device can be formed with the semiconductor fins in a logic region, and additional masks for forming the semiconductor fins 112 and the isolation structure 120 of the memory device can be saved. Moreover, the metal alloy layer 340 of the memory device can be formed with metal alloy layers in the logic region, and additional masks for forming the metal alloy layer 340 is also saved. Thus, the formation of the memory cells 10 above the semiconductor fins 112 does not complicate the manufacturing process for forming the memory device.

Figure 17A:
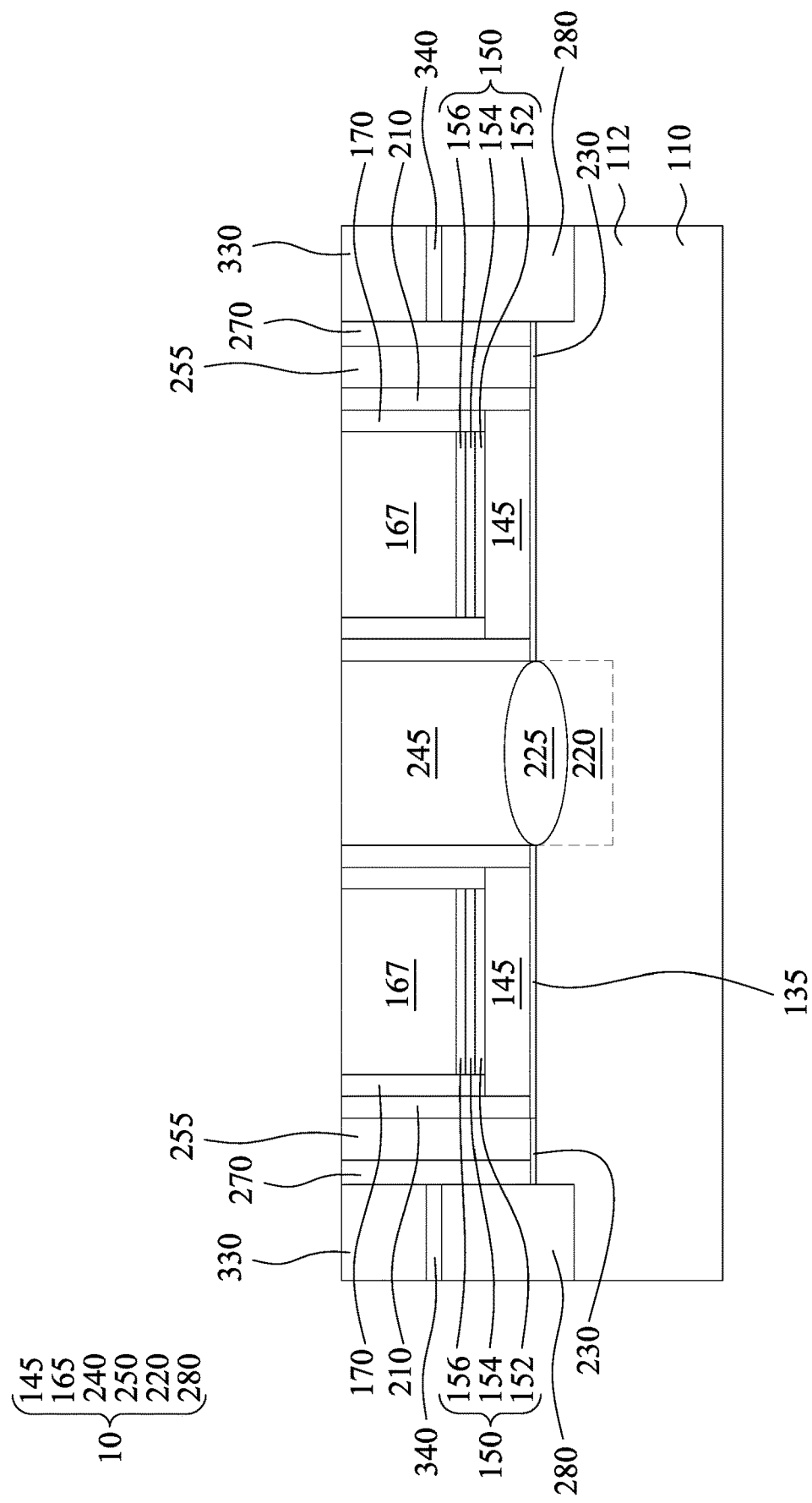
FIGS. 17A and 17B are cross-sectional views of the memory device according to some embodiments.
Figure 17B:
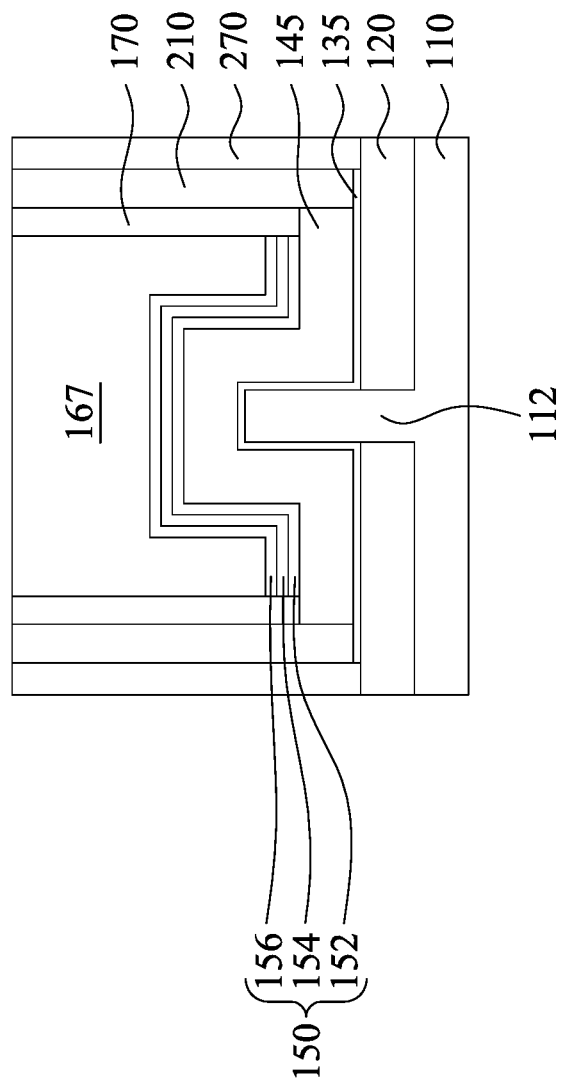

FIGS. 17A and 17B are cross-sectional views of the memory device according to some embodiments. FIGS. 17A and 16B have the same cross-sectional position, and FIGS. 17B and 16C have the same cross-sectional position. The difference between the memory devices in FIG. 17A (FIG. 17B) and FIG. 16B (FIG. 16C) pertains to the materials of the gate structures (such as the control gates, the erase gates, and/or the select gates). In FIGS. 17A and 17B, a replacement gate (RPG) process scheme is employed after the formation of the ILD 320 and before the formation of the contacts 330 (and the metal alloy layer 340). In the RPG process scheme, a dummy polysilicon gate (the control gates 165, the erase gates 240, and/or the select gates 250 of FIG. 15 in this case) is formed in advance and is replaced later by a metal gate. In some embodiments, the control gates 165, the erase gates 240, and/or the select gates 250 are removed to form openings in the ILD 320. The control gates 165, the erase gates 240, and/or the select gates 250 may be removed by dry etch, wet etch, or a combination of dry and wet etch. For example, a wet etch process may include exposure to a hydroxide containing solution (e.g., ammonium hydroxide), deionized water, and/or other suitable etchant solutions.

Then, a gate dielectric layer is formed in the openings, and at least one metal layer is formed in the openings and on the gate dielectric layer. Subsequently, a chemical mechanical planarization (CMP) process is performed to planarize the metal layer and the gate dielectric layer to form metal gate structures 167, 245, and 255 respectively in the openings. The metal gate structure 167 may be referred to as a metal control gate, the metal gate structure 245 may be referred to as a metal erase gate, and the metal gate structure 255 may be referred to as a metal select gate. Each of the metal gate structures 167, 245, and 255 includes a gate dielectric layer and a metal gate electrode over the gate dielectric layer. The metal gate electrode may include metal layers, e.g., work function metal layer(s) and capping layer(s), a fill layer(s), and/or other suitable layers that are desirable in a metal gate stack. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the metal gate electrode is a p-type metal gate including a p-type work function metal layer. In some embodiments, the capping layer in the metal gate electrodes may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill layer in the metal gate electrodes may include tungsten (W). The fill layer may be deposited by ALD, PVD, CVD, or other suitable process. In some embodiments, the memory cell 10 includes the metal select gate 255, the metal erase gate 245, and/or the metal control gate 167. Other relevant structural details of the memory cells 10 in FIGS. 17A and 17B are similar to the memory cells 10 in FIGS. 16A-16C, and, therefore, a description in this regard will not be repeated hereinafter.

Figure 18:
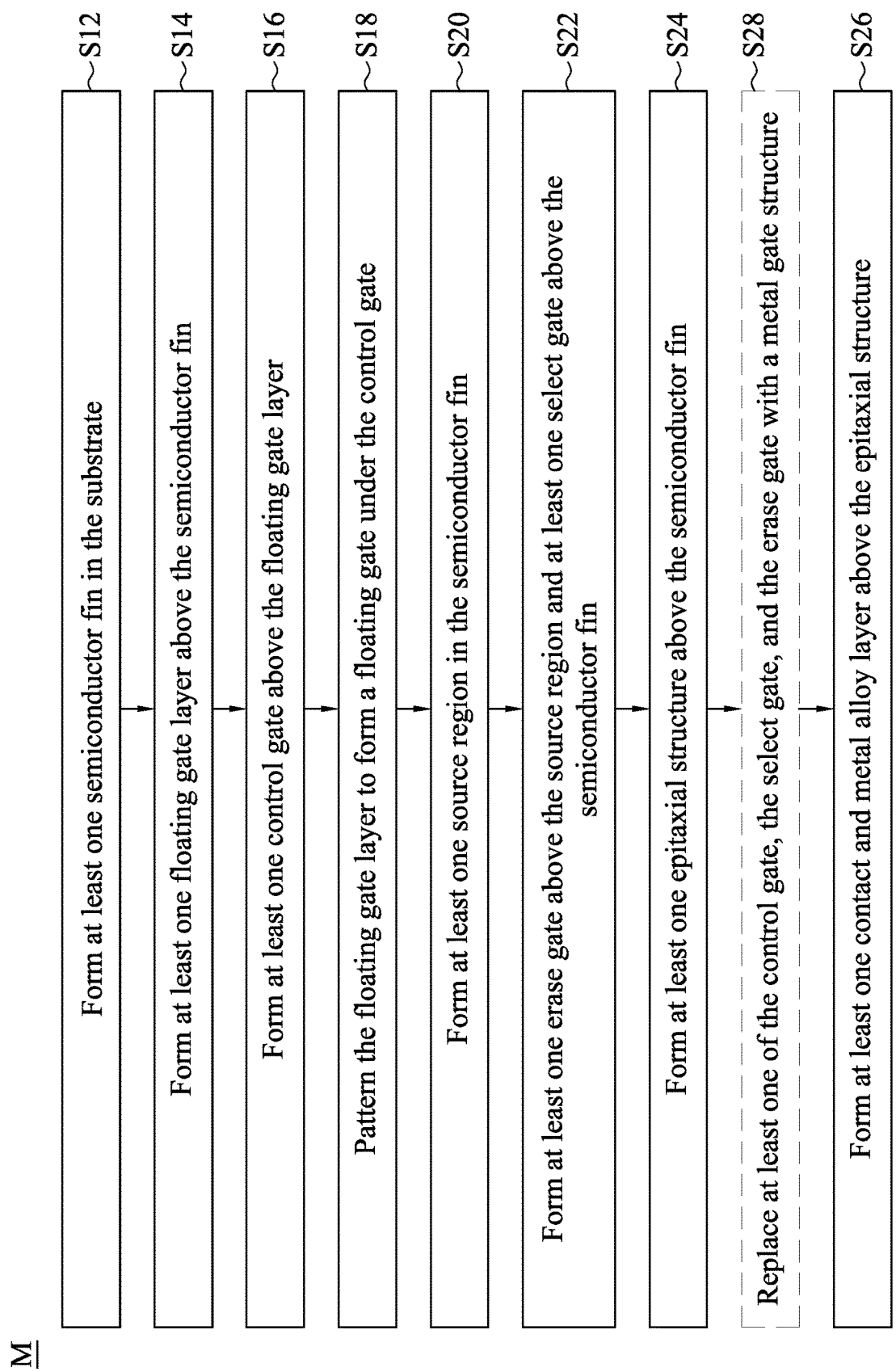
FIG. 18 is a flow chart of a method for forming a memory device in accordance with some embodiments of the present disclosure.

FIG. 18 is a flow chart of a method M for forming a memory device in accordance with some embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, at least one semiconductor fin is formed in the substrate. FIG. 1 illustrates a perspective view of some embodiments corresponding to act in block S12. At block S14, at least one floating gate layer is formed above the semiconductor fin. FIGS. 2-3 illustrate perspective views of some embodiments corresponding to act in block S14. At block S16, at least one control gate is formed above the floating gate layer. FIGS. 4-5 illustrate perspective views of some embodiments corresponding to act in block S16. At block S18, the floating gate layer is patterned to form a floating gate under the control gate. FIG. 7 illustrates a perspective view of some embodiments corresponding to act in block S18. At block S20, at least one source region is formed in the semiconductor fin. FIGS. 9A and 9B illustrate a perspective view and a cross-sectional view of some embodiments corresponding to act in block S20. At block S22, at least one erase gate is formed above the source region and at least one select gate is formed above the semiconductor fin. FIGS. 12-13B illustrates perspective views and cross-sectional views of some embodiments corresponding to act in block S22. At block S24, at least one epitaxial structure is formed above the semiconductor fin. FIGS. 14A and 14B illustrate a perspective view and a cross-sectional view of some embodiments corresponding to act in block S24. At block S26, at least one contact and metal alloy layer are formed above the epitaxial structure. FIGS. 16A-16C illustrate a perspective view and cross-sectional views of some embodiments corresponding to act in block S26.

In some embodiments, the method M further includes a block S28 between the blocks S24 and S26. At block S28, at least one of the control gate, the select gate, and the erase gate is replaced with a metal gate structure. FIGS. 17A and 17B illustrate cross-sectional views of some embodiments corresponding to act in block S28.

According to some embodiments, a memory device includes a semiconductor fin, a floating gate, a control gate, a source region, an erase gate, and a select gate. The floating gate is above and conformal to the semiconductor fin. The control gate is above the floating gate. The source region is in the semiconductor fin. The erase gate is above the source region and adjacent the control gate. The select gate is above the semiconductor fin. The control gate is between the erase gate and the select gate.

According to some embodiments, a memory device includes a semiconductor fin, an isolation structure, a floating gate, a control gate, an erase gate, and a select gate. The isolation structure is adjacent the semiconductor fin. The floating gate is above the semiconductor fin and the isolation structure. The control gate is above the floating gate. The control gate includes a first portion directly above the semiconductor fin and a second portion directly above the isolation structure, and the first portion is thinner than the second portion. The erase gate is above the semiconductor fin. The select gate is above the semiconductor fin.

According to some embodiments, a method for manufacturing a memory device includes forming a semiconductor fin in a substrate. A floating gate layer is formed above the semiconductor fin. A control gate is formed above the floating gate layer. The floating gate layer is patterned to form a floating gate between the control gate and the semiconductor fin. A source region is formed in the semiconductor fin. An erase gate is formed above the source region. A select gate is formed above the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a semiconductor fin;
   a floating gate above and conformal to the semiconductor fin;
   a control gate above the floating gate;
   an oxidation layer over and in contact with the control gate;
   a source region in the semiconductor fin;
   an erase gate above the source region and adjacent the control gate;
   a select gate above the semiconductor fin, wherein the control gate is between the erase gate and the select gate;
   a drain region, wherein the select gate is between the source region and the drain region; and
   a contact connected to the drain region, wherein a top surface of the contact is coplanar with a top surface of the oxidation layer.

2. The memory device of claim 1, wherein the drain region is an epitaxial structure protruding from the semiconductor fin, and the floating gate is between the source region and the epitaxial structure.

3. The memory device of claim 2, further comprising a metal alloy layer above the epitaxial structure.

4. The memory device of claim 3, wherein the metal alloy layer is at a level higher than a top surface of the floating gate.

5. The memory device of claim 3, wherein the metal alloy layer is at a level higher than a bottom surface of the control gate.

6. The memory device of claim 2, wherein a bottom surface of the epitaxial structure is lower than a bottom surface of the floating gate.

7. The memory device of claim 1, further comprising a control gate spacer structure surrounding the control gate and the oxidation layer.

8. The memory device of claim 1, further comprising a dielectric structure between the control gate and the floating gate, wherein the dielectric structure is conformal to the semiconductor fin.

9. The memory device of claim 1, wherein the select gate is a metal gate structure.

10. A memory device comprising:
    a semiconductor fin;
    an isolation structure adjacent the semiconductor fin;
    a floating gate above the semiconductor fin and the isolation structure;
    a control gate above the floating gate, wherein the control gate comprises a first portion directly above the semiconductor fin and a second portion directly above the isolation structure, and the first portion is thinner than the second portion;
    a dielectric structure between the second portion of the control gate and the semiconductor fin;
    a spacer structure directly above the isolation structure and in contact with a sidewall of the second portion of the control gate, a sidewall of the dielectric structure, and a top surface of the floating gate;
    an erase gate above the semiconductor fin; and
    a select gate above the semiconductor fin.

11. The memory device of claim 10, further comprising a word-line spacer structure surrounding the select gate.

12. The memory device of claim 11, wherein the word-line spacer structure is in contact with the select gate and the erase gate.

13. The memory device of claim 10, wherein the floating gate is conformal to the semiconductor fin and the isolation structure.

14. The memory device of claim 10, wherein the erase gate is in contact with the isolation structure.

15. The memory device of claim 10, wherein the select gate is in contact with the isolation structure.

16. A method for manufacturing a memory device comprising:
    forming a semiconductor fin in a substrate;
    forming a floating gate layer above the semiconductor fin;
    forming a pair of control gates above the floating gate layer;
    after forming the pair of control gates, patterning the floating gate layer to remove a portion of the floating gate layer between the pair of control gates to form a pair of floating gates respectively between the pair of control gates and the semiconductor fin;
    forming a source region in the semiconductor fin;
    forming an erase gate above the source region; and
    forming a select gate above the semiconductor fin.

17. The method of claim 16, further comprising:
    removing a portion of the semiconductor fin; and
    forming an epitaxial structure above the semiconductor fin.

18. The method of claim 16, wherein forming the source region comprises implanting the semiconductor fin.

19. The method of claim 16, further comprising replacing the select gate with a metal gate structure.

20. The method of claim 16, further comprising after forming the source region in the semiconductor fin, forming a gate dielectric layer in contact with the semiconductor fin and a cap layer in contact with one of the pair of control gates simultaneously.

* * * * *